(12) United States Patent
Cho et al.

(10) Patent No.: US 10,706,953 B2
(45) Date of Patent: Jul. 7, 2020

(54) SEMICONDUCTOR MEMORY DEVICES AND METHODS OF OPERATING SEMICONDUCTOR MEMORY DEVICES

(71) Applicant: Samsung Electronics Co., Ltd., Suwon-si (KR)

(72) Inventors: Seok-Jin Cho, Seoul (KR); Tae-Young Oh, Seoul (KR); Jung-Hwan Park, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/215,752

(22) Filed: Dec. 11, 2018

(65) Prior Publication Data

US 2019/0348140 A1   Nov. 14, 2019

(30) Foreign Application Priority Data

May 10, 2018 (KR) .......................... 10-2018-0053515

(51) Int. Cl.
| | |
|---|---|
| *G11C 29/44* | (2006.01) |
| *G06F 11/10* | (2006.01) |
| *G11C 11/408* | (2006.01) |
| *G11C 11/4091* | (2006.01) |
| *G11C 29/52* | (2006.01) |

(52) U.S. Cl.
CPC .......... *G11C 29/44* (2013.01); *G06F 11/1068* (2013.01); *G11C 11/4085* (2013.01); *G11C 11/4087* (2013.01); *G11C 11/4091* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 5,978,291 | A | 11/1999 | Kirihata |
| 6,052,318 | A | 4/2000 | Kirihata et al. |

(Continued)

FOREIGN PATENT DOCUMENTS

| | | |
|---|---|---|
| KR | 1020030094684 A | 12/2003 |
| KR | 10-2013-0050233 | 5/2013 |

OTHER PUBLICATIONS

Extended European Search Report, dated Jul. 25, 2019, from the European Patent Office in corresponding European Patent Application No. 19153331.4 (9 pages).

(Continued)

*Primary Examiner* — James G Norman
(74) *Attorney, Agent, or Firm* — Muir Patent Law, PLLC

(57) ABSTRACT

A semiconductor memory device includes a memory cell array and an address decoder. The memory cell array includes a plurality of memory blocks, each of the plurality of memory blocks includes a plurality of dynamic memory cells coupled to word-lines and bit-lines, each of the plurality of memory blocks are divided into a plurality of row blocks by row block identity bits of a row address, and each of the of row blocks includes a plurality of sub-array blocks arranged in a first direction. The address decoder changes a physical row address of a memory cell that stores or outputs data based on a column address received with a write command or a read command.

20 Claims, 22 Drawing Sheets

(56) References Cited

U.S. PATENT DOCUMENTS

| | | | |
|---|---|---|---|
| 6,199,177 B1 | 3/2001 | Blodgett | |
| 6,233,181 B1 | 5/2001 | Hidaka | |
| 6,490,208 B2 | 12/2002 | Yoon | |
| 6,657,907 B2 | 12/2003 | Lee | |
| 6,865,124 B2 | 3/2005 | Takase | |
| 9,287,004 B2 | 3/2016 | Kim et al. | |
| 2005/0185483 A1 | 8/2005 | Sugiura et al. | |
| 2008/0266990 A1 | 10/2008 | Loeffler | |
| 2009/0168569 A1* | 7/2009 | Ryu | G11C 29/808 365/200 |
| 2012/0195144 A1 | 8/2012 | Ide et al. | |
| 2013/0117615 A1 | 5/2013 | Kim et al. | |
| 2013/0117636 A1 | 5/2013 | Kim et al. | |
| 2015/0117083 A1 | 4/2015 | Son et al. | |
| 2016/0034371 A1* | 2/2016 | Oh | G06F 3/0619 714/6.2 |
| 2017/0110206 A1 | 4/2017 | Ryu et al. | |
| 2017/0133108 A1 | 5/2017 | Lee et al. | |
| 2018/0067847 A1 | 3/2018 | Oh et al. | |

OTHER PUBLICATIONS

Examination Report, dated Feb. 24, 2020, issued from the India Patent Office for corresponding India Patent Application No. 201824048013 (7 pages).

\* cited by examiner

SEMICONDUCTOR MEMORY DEVICES AND METHODS OF OPERATING SEMICONDUCTOR MEMORY DEVICES

CROSS-REFERENCE TO RELATED APPLICATIONS

This U.S. application claims the benefit of priority under 35 U.S.C. § 119 to Korean Patent Application No. 10-2018-0053515, filed May 10, 2018, in the Korean Intellectual Property Office, the disclosure of which is incorporated by reference in its entirety herein.

BACKGROUND

The present disclosure relates to memory devices, and more particularly to semiconductor memory devices and methods of operating semiconductor memory devices.

Semiconductor chips are manufactured through semiconductor manufacturing processes, and then tested by a test device in a wafer, a die, or a package state. Defective portions of defective chips are identified through testing, and if some of memory cells are defective, repairs are performed to save semiconductor chips. Currently, semiconductor chips such as dynamic random access memories (DRAMs) have been continued to be reduced in size through fine processes, and accordingly, the possibility of errors occurring during manufacturing process have been increased. In addition, if defects are not detected through initial test processes, errors may occur during chip operations.

SUMMARY

Exemplary embodiments may provide a semiconductor memory device capable of increasing flexibility of column repair operation.

Exemplary embodiments may provide a method of operating a semiconductor memory device, capable of increasing flexibility of column repair operation.

According to exemplary embodiments, the disclosure is directed to a semiconductor memory device comprising: a memory cell array including a plurality of memory blocks, each of the plurality of memory blocks including a plurality of dynamic memory cells coupled to word-lines and bit-lines, wherein each of the plurality of memory blocks are divided into a plurality of row blocks by at least one row block identity bit corresponding to a portion of bits of a row address, and each of the row blocks includes a plurality of sub-array blocks arranged in a first direction; a row decoder configured to activate a first word-line in a first row block of the plurality of row blocks in response to the row address, configured to activate a second word-line in a second row block of the plurality of row blocks, the second row block being different from the first row block, when the first row block includes at least one defective cell, and configured to output a row block information signal indicating whether the second word-line is activated, wherein the first row block is associated with a first segment of a plurality of segments, the second row block is associated with a second segment of the plurality of segments, the second segment being different from the first segment, and the plurality of memory blocks are divided into the plurality of segments in a second direction crossing the first direction; and a column decoder configured to repair a first bit-line coupled to the at least one defective cell with one of a first spare bit-line in the first segment and a second spare bit-line in the second segment in response to a column address and the row block information signal.

According to exemplary embodiments, the disclosure is directed to a semiconductor memory device comprising: a memory cell array including a plurality of memory blocks, each of the plurality of memory blocks including a plurality of dynamic memory cells coupled to word-lines and bit-lines, wherein each of the plurality of memory blocks is divided into a plurality of row blocks by row block identity bits corresponding to a portion of bits of a row address, and each of the row blocks includes a plurality of sub-array blocks arranged in a first direction; and an address decoder configured to change a physical row address of a memory cell that stores or outputs data based on a column address received with a write command or a read command.

According to exemplary embodiments, the disclosure is directed to a method of operating a semiconductor memory device, wherein the semiconductor memory device includes a memory cell array including a plurality of memory blocks, each of the plurality of memory blocks including a plurality of dynamic memory cells coupled to word-lines and bit-lines, wherein each of the plurality of memory blocks is divided into a plurality of row blocks by a row block identity bit corresponding to a portion of bits of a row address, and each of the row blocks includes a plurality of sub-array blocks arranged in a first direction, the method comprising: activating, by a row decoder, a first word-line in a first row block of the plurality of row blocks in response to the row address; activating a second word-line in a second row block of the plurality of row blocks different from the first row block when the first row block includes at least one defective cell; and repairing, by a column decoder, a first bit-line coupled to the at least one defective cell with one of a first spare bit-line in a first segment of a plurality of segments and a second spare bit-line in a second segment of the plurality of segments in response to a column address and a row block information signal, wherein the row block information signal indicates that the first row block includes the at least one defective cell.

BRIEF DESCRIPTION OF THE DRAWINGS

Exemplary embodiments will be described below in more detail with reference to the accompanying drawings.

DETAILED DESCRIPTION

Various exemplary embodiments will be described more fully hereinafter with reference to the accompanying drawings, in which exemplary embodiments are shown.

Figure 1:
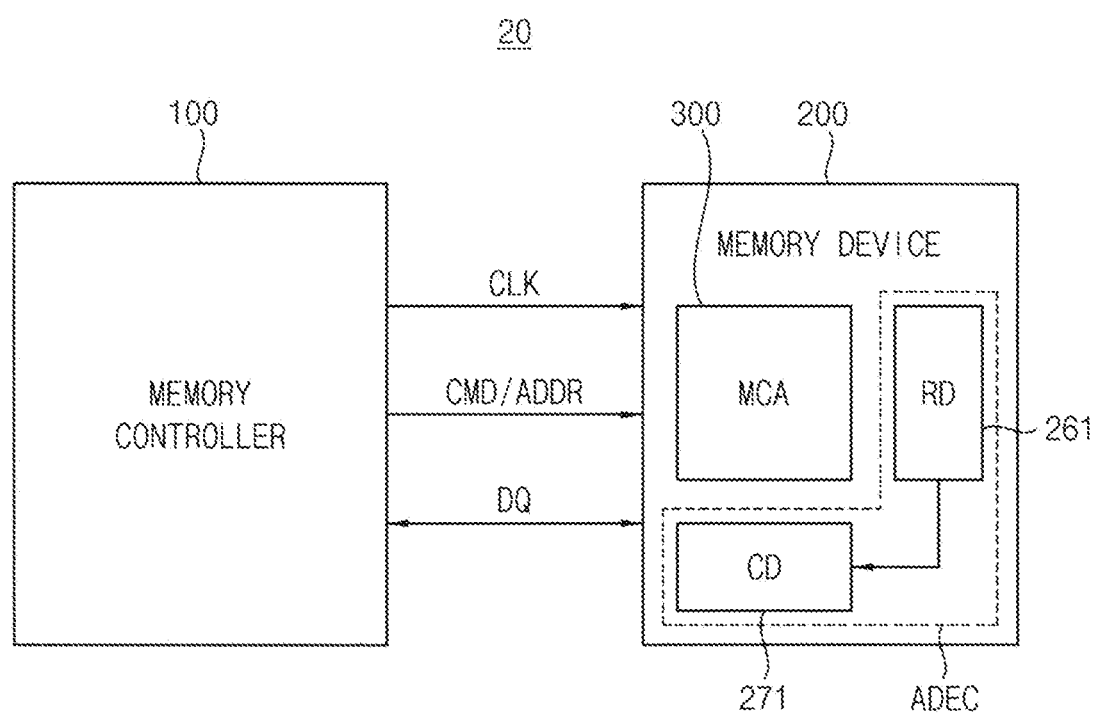
FIG. 1 is a block diagram illustrating a memory system according to exemplary embodiments.

FIG. 1 is a block diagram illustrating a memory system according to exemplary embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to requests from the external host. In addition, the memory controller 100 may issue operation commands to the semiconductor memory device 200 for controlling the semiconductor memory device 200.

In some embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, or a LPDDR5 SDRAM.

The memory controller 100 transmits a clock signal CLK, a command CMD, and an address (signal) ADDR to the semiconductor memory device 200, and exchanges data DQ with the semiconductor memory device 200.

The semiconductor memory device 200 includes a memory cell array (MCA) 300 that stores the data DQ received from the memory controller 100, and an address decoder ADEC. The address decoder ADEC may include a row decoder (RD) 261 and a column decoder (CD) 271.

The memory cell array 300 may include a plurality of memory blocks and each of the memory blocks may be divided into a plurality of row blocks by a row block identity bit corresponding to a portion of bits of a row address included in the address ADDR. The row decoder 261 may activate a first word-line in a first row block in response to the row address, may activate a second word-line in a second row block different from the first row block when the first row block includes at least one defective cell, and may provide the column decoder 271 with a row block information signal indicating that the second word-line is activated. In example embodiments, the first row block and the second row block may be in the same memory bank.

The first row block may be associated with a first segment of a plurality of segments, the second row block may be associated with a second segment of the plurality of segments, the second segment being different from the first segment, and the plurality of memory blocks may be divided into the plurality of segments in a second direction crossing the first direction.

The column decoder 271 may repair a first bit-line coupled to the at least one defective cell with one of a first spare bit-line in the first segment and a second spare bit-line in the second segment in response to a column address in the address ADDR and the row block information signal. For example, the address decoder ADEC may change a physical row address of a memory cell that stores or outputs data based on the column address. In such embodiments, the semiconductor memory device 200 may increase flexibility of column repair operation.

Figure 2:
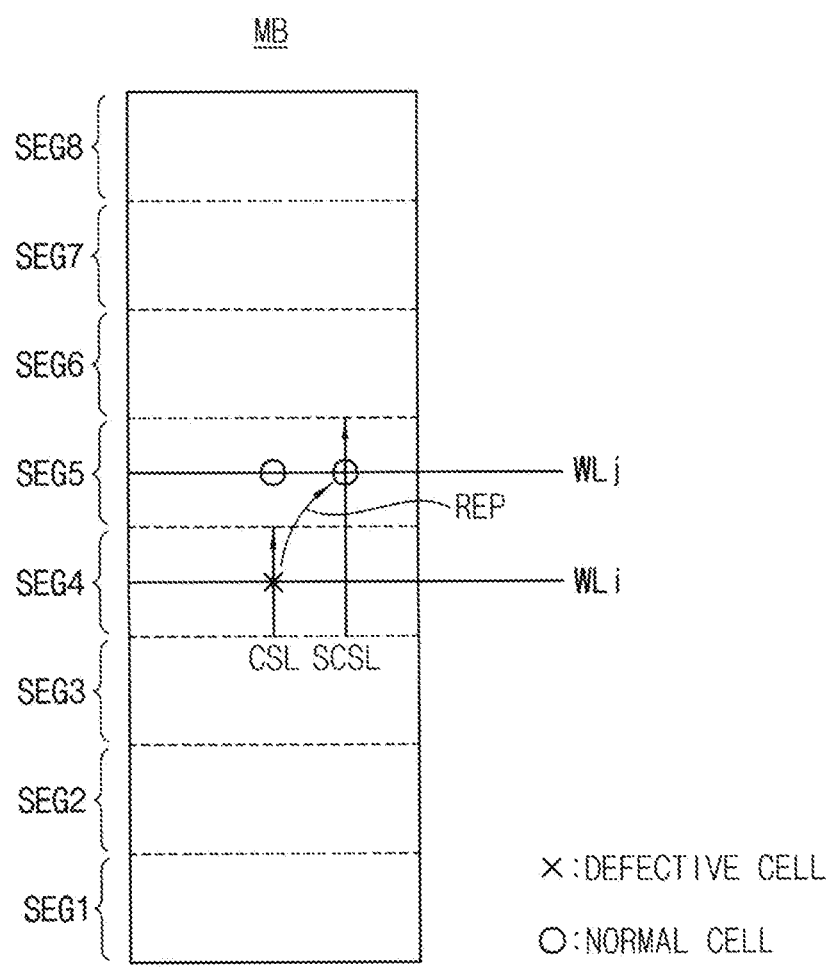
FIG. 2 illustrates that the semiconductor memory device performs a column repair operation according to example embodiments.

FIG. 2 illustrates that the semiconductor memory device performs a column repair operation according to example embodiments.

FIG. 2 illustrates that the address decoder ADEC performs a column repair operation on a memory block MB included in the memory cell array 300 in FIG. 1.

Referring to FIG. 2, the memory block MB is divided into a plurality of segments SEG1~SEG8. When a word-line WLi in the segment SEG4 is coupled to a defective cell, the defective cell in segment SEG4 is repaired with a spare cell coupled to a word-line WLj in the segment SEG5 instead of the defective cell in segment SEG4 being repaired with a spare cell coupled to the word-line WLi in the segment SEG4. When spare cells in the segment SEG4 cannot repair defective cells in the segment SEG4, the repair operation may be performed by borrowing spare cells in another segment. In such embodiments, the semiconductor memory device 200 may increase flexibility of column repair operation and manufacturing yield.

In FIG. 2, a memory cell coupled to a bit-line may be selected by a column selection line CSL and a spare normal cell coupled to a spare bit-line may be selected by a spare column selection line SCSL. In the example of FIG. 2, the defective memory cell in segment SEG4, which is coupled to the word-line WLi and selected by the column selection line CSL, is repaired REP by the spare normal memory cell in segment SEG5, which is coupled to the word-line WLj and selected by the spare column selection line SCSL.

Figure 3:
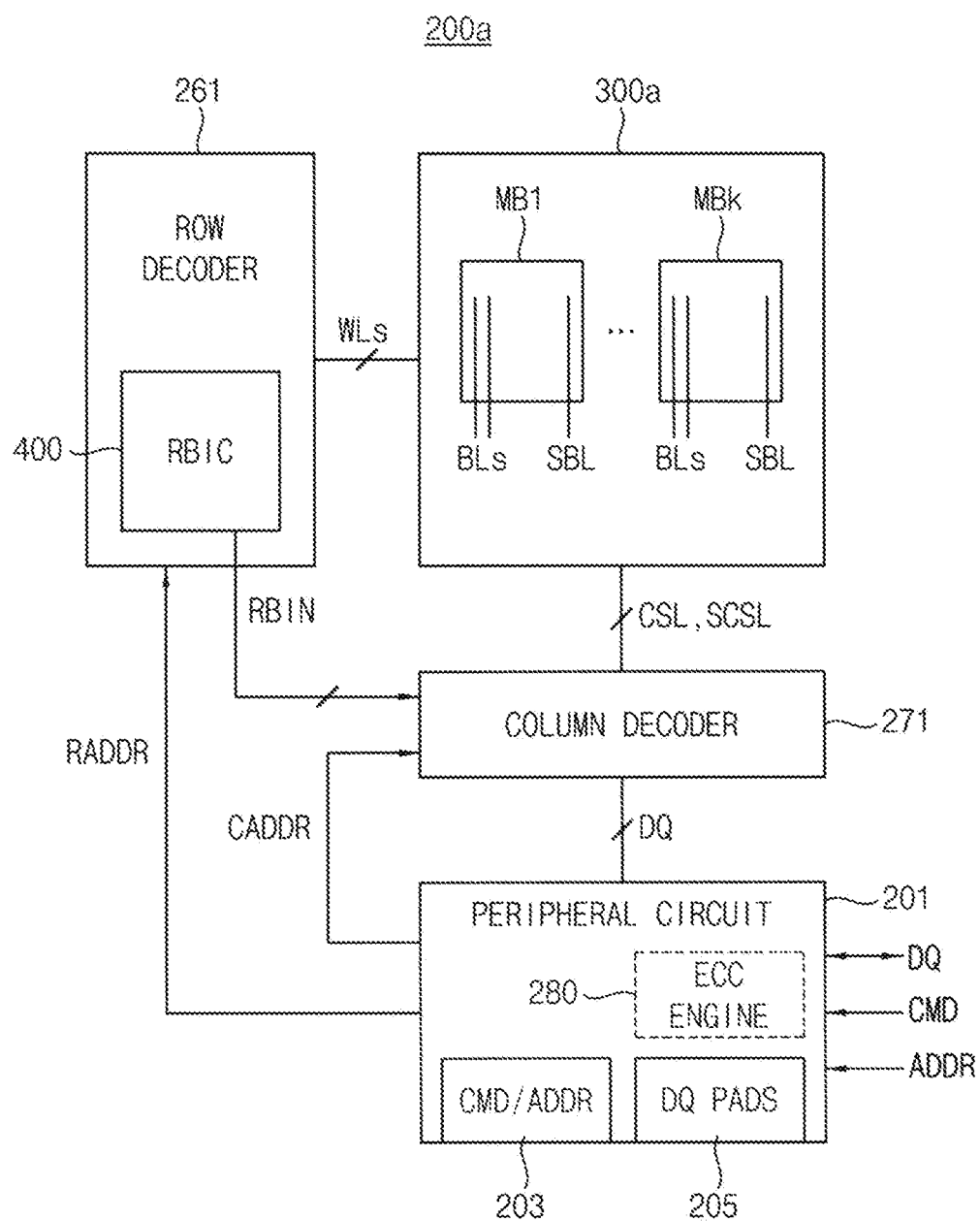
FIG. 3 is a block diagram illustrating an example of the semiconductor memory device in FIG. 1 according to example embodiments.

FIG. 3 is a block diagram illustrating an example of the semiconductor memory device in FIG. 1 according to example embodiments.

Referring to FIG. 3, a semiconductor memory device 200a includes a memory cell array 300a, a row decoder 261, a column decoder 271 and a peripheral circuit 201.

The memory cell array 300a may include a plurality of memory blocks MB1~MBk (where k is an integer greater than one), and each of the memory blocks MB1~MBk includes memory cells coupled to word-lines WLs and bit-lines BLs and spare memory cells coupled to the word-lines WLs and at least one spare bit-line SBL. The memory blocks MB1~MBk share the word-line WLs and do not share the bit-lines BLs and the spare bit-line SBL. For example, each of the word-lines WLs may be connected to all of the memory blocks MB1~MBk, whereas the bit-lines BLs and the spare bit-line SBL may be connected only to one corresponding memory block MB of the memory blocks MB1~MBk. Data associated with each of the memory blocks MB1~MBk may be input/output through corresponding input/output pads (not shown) of the memory cell array 300a.

The semiconductor memory device 200a may receive an active command before receiving a write command or a read command from an external device (e.g., a memory controller or test equipment). All memory cells connected to the word-line WL of the semiconductor memory device 200a identified by the active command may be selected based on the active command. Next, if the semiconductor memory device 200a receives the write command or the read command, a plurality of bit-lines BLs may be selected. In an embodiment, one or more of the bit-lines BLs illustrated in the memory blocks MB1~MBk may be selected by the write command or the read command. The data input/output may be performed on memory cells coupled to the selected bit-lines BLs.

Parity data for error correction of data stored in at least one of the memory blocks MB1~MBk may be stored in some of the memory blocks MB1~MBk.

The column decoder 271 may be connected to the memory cell array 300a through column selection lines CSL and spare column selection lines SCSL. The column decoder 271 may select the column selection lines CSL or the spare column selection lines SCSL based on a write command or a read command. If the column decoder 271 selects the column selection lines CSL, the corresponding bit-lines BLs are selected. When the column decoder 271 selects the spare column selection lines SCSL, the corresponding spare bit-lines SBL are selected.

The peripheral circuit 201 may include command/address pads (CMD/ADD) 203, input/output data (DQ) pads 205, and an error correction code (ECC) engine 280. In some embodiments, the ECC engine 280 may not be included in the peripheral circuit 201. The peripheral circuit 201 may receive the command CMD and the address ADDR from external device (e.g., from memory controller 100) and may exchange data DQ with the external device (e.g., with memory controller 100).

The peripheral circuit 201 may provide a column address CADDR to the column decoder 271 and may provide a row address RADDR to the row decoder 261 according to the command CMD received from the external device (e.g., from memory controller 100). The peripheral circuit 201 may provide input data DQ to the column decoder 271 in response to the write command or may receive output data DQ from the column decoder 271 in response to the read command. The input data may be input to the peripheral circuit 201 through the input/output data (DQ) pads 205. The output data may be output to the memory controller 100 through the input/output data (DQ) pads 205.

The ECC engine 280 may perform an ECC encoding on the input data to generate parity data. The ECC engine 280 may store the input data and the parity data in the memory blocks MB1~MBk. The ECC engine 280 may perform an ECC decoding on the data read from the memory blocks MB1~MBk to correct at least one error in the read data. The ECC engine 280 may transmit the corrected data to the memory controller 100 through the input/output data (DQ) pads 205.

The row decoder 261 may activate a first word-line WL in a first row block designated by the row address RADDR in response to the row address RADDR, may activate a second word-line WL in a second row block different from the first row block when the first row block includes at least one defective cell, and may output a row block information signal RBIN indicating that the second word-line WL is activated. The row decoder 261 may include a row block information circuit 400, and the row block information circuit 400 may store row block information of each row block of the memory blocks MB1~MBk and may output the row block information signal RBIN to the column decoder 271 based on an activation of the second word-line WL.

Figure 4:
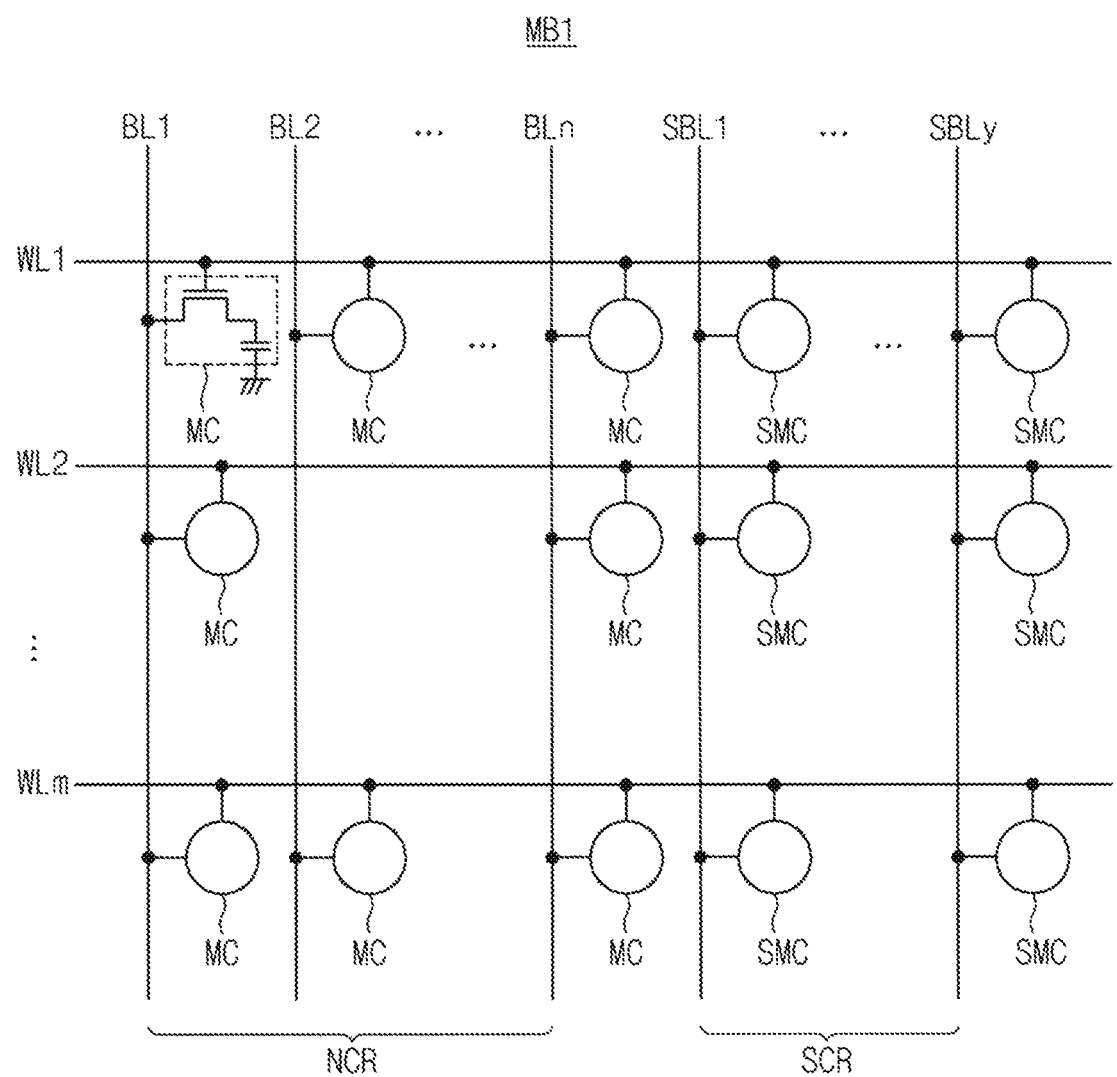
FIG. 4 illustrates an example of a first memory block in the example semiconductor memory device of FIG. 3.

FIG. 4 illustrates an example of a first memory block in the semiconductor memory device of FIG. 3.

Referring to FIG. 4, the first memory block MB1 includes a normal cell region NCR and a spare cell region SCR. The normal cell region NCR includes a plurality of word-lines WL1~WLm (m is a natural number greater than two), a plurality of bit-lines BL1~BLn (n is a natural number greater than two), and a plurality of memory cells MCs disposed at intersections between the word-lines WL1~WLm and the bit-lines BL1~BLn. The spare cell region SCR includes a plurality of spare bit-lines SBL1~SBLy (y is a natural number greater than two), the word-lines WL1~WLm, and a plurality of spare memory cells SMCs disposed at intersections between the word-lines WL1~WLm and the spare bit-lines SBL1~SBLy.

The word-lines WL1~WLm extend lengthwise in a first direction D1 and the bit-lines BL1~BLn and the spare bit-lines SBL1~SBLy may extend lengthwise in a second direction D2 crossing the first direction D1. The first memory block MB1 may be divided into a plurality of segments in the second direction D2 by segment identity bits of the row address. For example, the word-lines WL1~WLm of the first memory block MB1 may be grouped into segments that are identified by segment identity bits of the row address.

In exemplary embodiments, other memory blocks MBs of the memory blocks MB2~MBk may only include the normal cell region NCR and may not include the spare cell region SCR.

Figure 5:
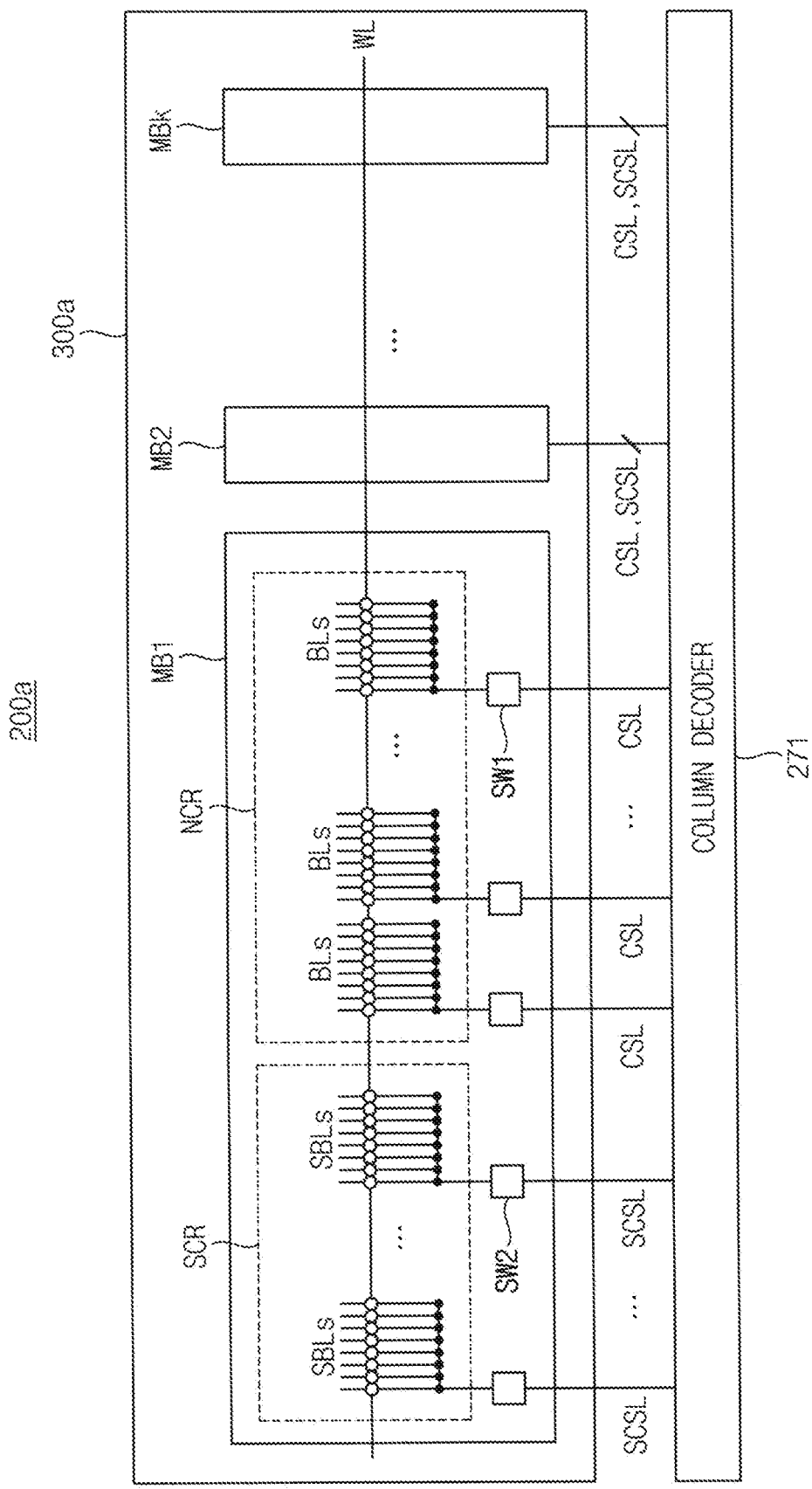
FIG. 5 illustrates a relationship between column selection lines and bit-lines shown in the example semiconductor memory device of FIG. 3.

FIG. 5 illustrates a relationship between column selection lines CSLs and bit-lines BLs shown in FIG. 3.

In FIG. 5, only the first memory block MB1 is shown in detail for brevity of illustration. Each of the memory blocks MB2~MBk may be configured and/or implemented the same as the first memory block MB1. Also, for brevity of illustration, only one word-line WL is illustrated in FIG. 5, and the peripheral circuit 201 and the row decoder 261 in FIG. 3 are not illustrated.

The column decoder 271 may select the column selection lines CSL of each of the memory blocks MB1~MBk based on the write command or the read command. Each of the column selection lines CSL may be connected with a plurality of bit-lines BLs through a switch SW1. The column decoder 271 may selectively select the spare column selection lines SCSL of each of the memory blocks MB1~MBk based on the write command or the read command instead of the column selection line CSL. The spare column selection lines SCSL may be connected with spare bit-lines SBLs through a switch SW2.

Figure 6:
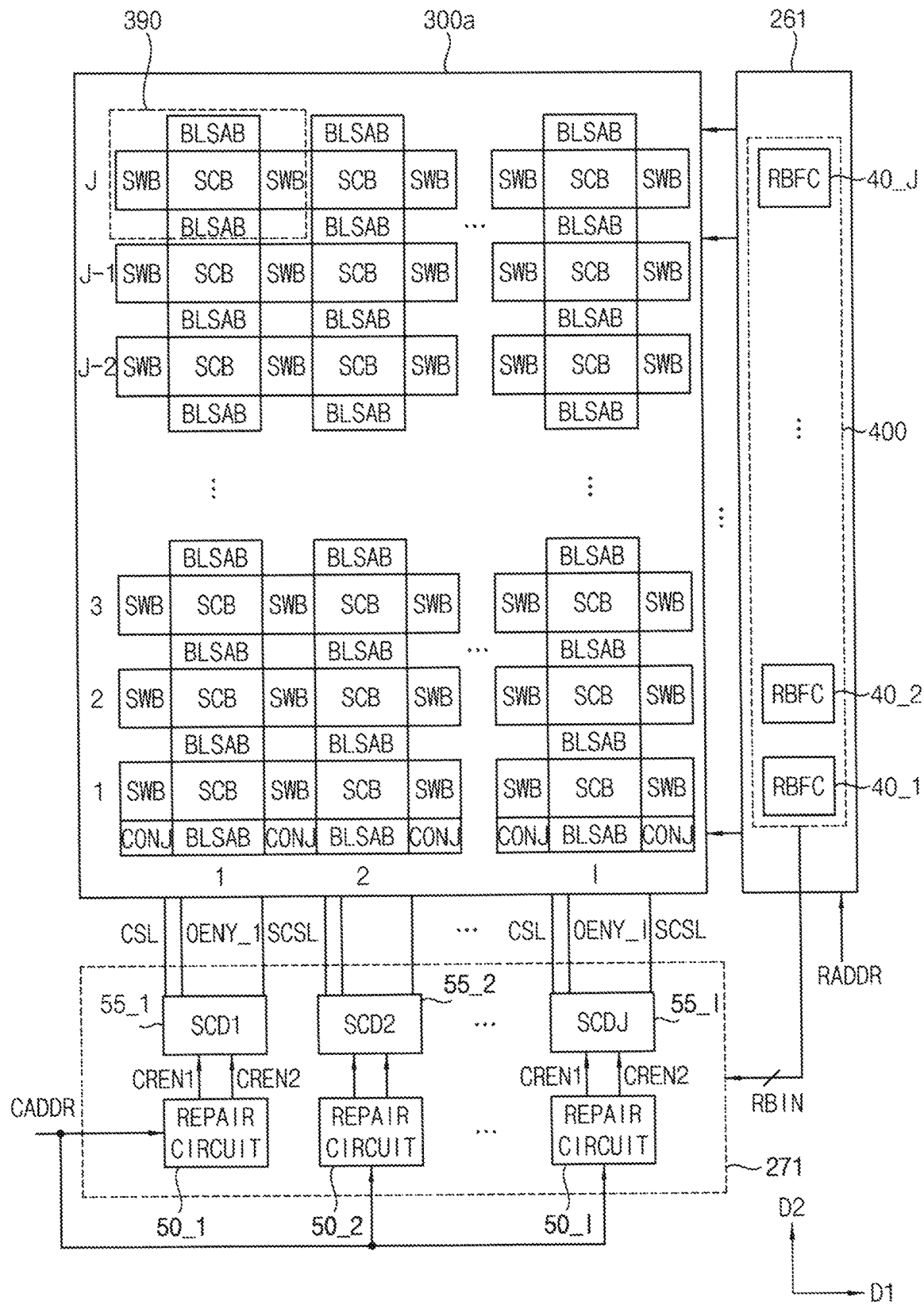
FIG. 6 illustrates the memory cell array, the row decoder and the column decoder in the example semiconductor memory device of FIG. 3.

FIG. 6 illustrates the memory cell array, the row decoder, and the column decoder in the semiconductor memory device of FIG. 3.

Referring to FIG. 6, in the memory cell array 300a, I sub-array blocks SCB may be disposed in columns 1 through I in the first direction D1, and J sub-array blocks SCB may be disposed in rows 1 through J in the second direction D2, the second direction being substantially perpendicular to the first direction D1. For example, the memory cell array 300a may include sub-array blocks $SCB_{1,1}$ through $SCB_{I,J}$. Sub-array blocks SCB disposed in the first direction D1 in any one row of rows 1 through J may be referred to as a row block. For example, the sub-array blocks SCB in row 1 may be a 1st row block, the sub-array blocks SCB in row 2 may be a 2nd row block, the sub-array blocks SCB in row 3 may be a 3rd row block, etc. A plurality of bit-lines, a plurality of word-lines, and a plurality of memory cells may be disposed in each of the sub-array blocks SCB.

In FIG. 6, one sub-array block SCB in the second direction D2 may correspond to a memory segment and all the sub-array blocks SCB in the first direction D1 may correspond to a row block.

Although not illustrated, the memory cell array 300a may be divided into a plurality of memory blocks in the first direction D1, where each of the memory blocks in the first direction D1 comprises one or more sub-array blocks, and each of the memory blocks may be divided into a plurality of segments in the second direction D2, where each memory blocks in the second direction D2 may be comprised of one or more sub-array blocks. In some embodiments, each of the plurality of segments may include at least one sub-array block SCB.

I+1 sub word-line driver regions SWB may be disposed between the sub-array blocks SCB in the first direction D1. Each sub-array block SCB in the first direction D1 may correspond to a segment of each of the memory blocks. Sub word-line drivers may be disposed in the sub word-line driver regions SWB. J+1 bit-line sense amplifier regions BLSAB may be disposed, for example, between the sub-array blocks SCB in the second direction D2. Bit-line sense amplifiers to sense data stored in the memory cells may be disposed in the bit-line sense amplifier regions BLSAB.

A plurality of conjunction regions CONJ may be disposed adjacent the sub word-line driver regions SWB and the bit-line sense amplifier regions BLSAB. In some embodiments, the plurality of conjunction regions CONJ may be adjacent to the sub word-line driver regions SWB and to the bit-line sense amplifier regions BLSAB of the first row of the memory array 300a. A voltage generator is disposed in each of the conjunction regions CONJ.

The row decoder 261 includes the row block information circuit 400 and the row block information circuit 400 may include a plurality of row block fuse circuits (RBFCs) 40_1~40_J corresponding to the row blocks in the second direction D2. The row block fuse circuits (RBFCs) 40_1~40_J may output the row block information signal RBIN to the column decoder 271 in response to the row block identity bits of the row address RADDR.

The column decoder 271 may include a plurality of sub column decoders (SCD) 55_1~55_I and a plurality of repair circuits 50_1~50_I. Each of the sub column decoders 55_1~55_I may be connected to a corresponding one of the memory sub-array blocks SCB, and each of the plurality of repair circuits 50_1~50_I may correspond to one of the plurality of sub column decoders 55_1~55_I. Each of the repair circuits 50_1~50_I may selectively activate a first repair signal CREN1 and a second repair signal CREN2 in response to the column address CADDR and the row block information signal RBIN to provide the first repair signal CREN1 and the second repair signal CREN2 to a corresponding one of the sub column decoders 55_1~55_I. In response to the first repair signal CREN1 and the second repair signal CREN2, each of the sub column decoders 55_1~55_I may select the column selection lines CSL or the spare column selection line SCSL and may individually activate second enable signals ONEY_1~OENY_I. When the first repair signal CREN1 and the second repair signal CREN2 are deactivated by the repair circuits 50_1~50_I, each of the sub column decoders 55_1~55_I may select the column selection lines CSL, while not activating the second enable signals ONEY_1~OENY_I.

When the first repair signal CREN1 is activated, the second repair signal CREN2 is deactivated and each of the second enable signals ONEY_1~OENY_I is deactivated, each of the sub column decoders 55_1~55_I may select the spare column selection lines SCSL such that the data is input/output through a spare bit-line SBL coupled to the spare column selection line SCSL in a segment which is the same as a segment including a memory cell designated by the row address RADDR. When the first repair signal CREN1 is deactivated, the second repair signal CREN2 is activated and each of the second enable signals ONEY_1~OENY_I is activated, each of the sub column decoders 55_1~55_I may select the spare column selection lines SCSL such that the data is input/output through a spare bit-line SBL coupled to the spare column selection line SCSL in a segment which is different from a segment including a memory cell designated by the row address RADDR.

Figure 7A:
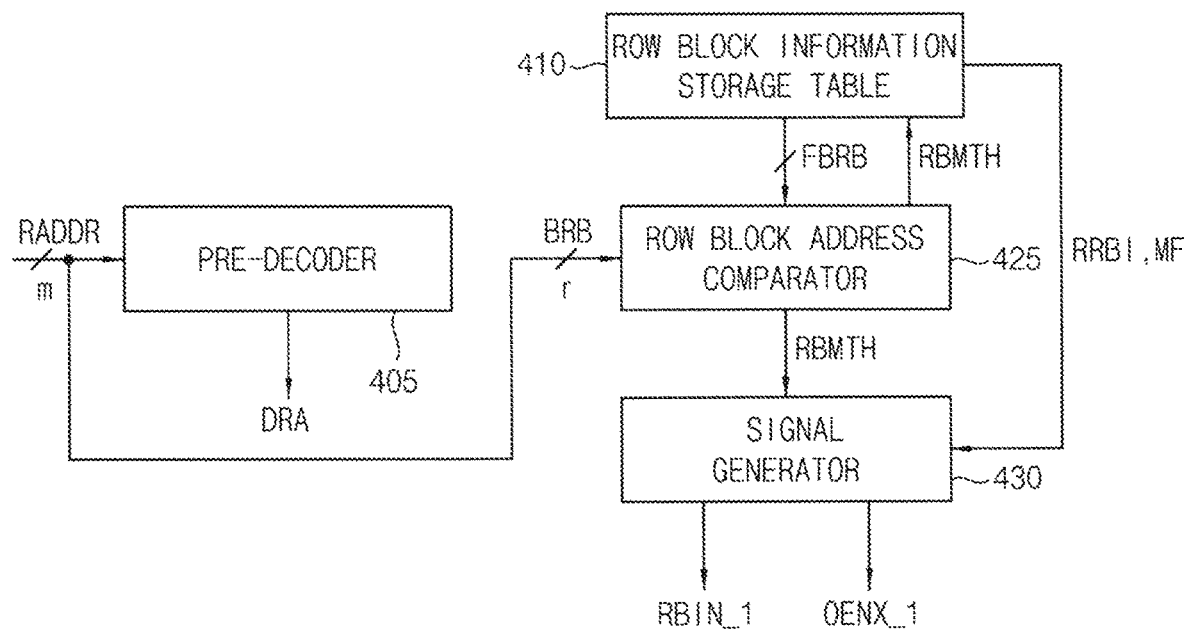
FIG. 7A is a block diagram illustrating a first row fuse circuit of the row block fuse circuits in FIG. 6 according to example embodiments.

FIG. 7A is a block diagram illustrating a first row fuse circuit 40_1 of the row block fuse circuits in FIG. 6 according to example embodiments.

Each configuration of the row block fuse circuits 40_2~40_J may be substantially the same as a configuration of the first row block fuse circuit 40_1.

Referring to FIG. 7A, the first row block fuse circuit 40_1 may include a pre-decoder 405, a row block information storage table 410, a row block address comparator 425, and a signal generator 430.

The pre-decoder 405 decodes the row address RADDR to provide a decoded row address DRA to a corresponding sub word-line driver disposed in a sub word-line driver region SWB. The corresponding sub word-line driver may activate a word-line corresponding to the decoded row address DRA, in response to the decoded row address DRA provided by the pre-decoder 405.

The row block information storage table 410 may store defective row address FBRB associated with a defective row block including the at least one defective cell, a row block address information of a corresponding row block, a replacement row block information RRBI to determine whether to activate the second word-line, and a master fuse bit MF indicating whether the corresponding row block is capable of being used as a replacement row block.

The row block information storage table 410 may provide the defective row address FBRB to the row block address comparator 425, and the row block comparator 425 may compare row block identity bits BRB received from the pre-decoder 405 with the defective row block address FBRB to provide the row block information table 410 and the signal generator 430 with a row block match signal RBMTH indicating a result of the comparison of the row block identity bits BRB and with the defective row block address FBRB. The row block identity bits BRB may include some upper bits of the row address RADDR. For example, as discussed in connection with FIG. 8, when the row address RADDR includes m-bits, the upper r-bits of the row address RADDR may correspond to the row block identity bits BRB.

The row block information storage table 410 may provide the signal generator 430 with a replacement row block information RRBI of a row block including the second word-line and the master fuse bit MF, in response to the row block match signal RBMTH.

The signal generator 430 may output the row block information signal RBIN_1 and a first enable signal ONEX_1 in response to the row block match signal RBMTH and the replacement row block information RRBI. The row block information signal RBIN_1 may indicate that the second word-line in the second row block is activated and that the corresponding first row block includes the defective cell. The first enable signal ONEX_1 may determine activation of a local sense amplifier circuit associated with the second segment, which includes the second row block. The signal generator 430 may provide the row block information signal RBIN_1 to the column decoder 271 and may provide the first enable signal OENX_1 to a corresponding bit-line sense amplifier region.

Figure 7B:
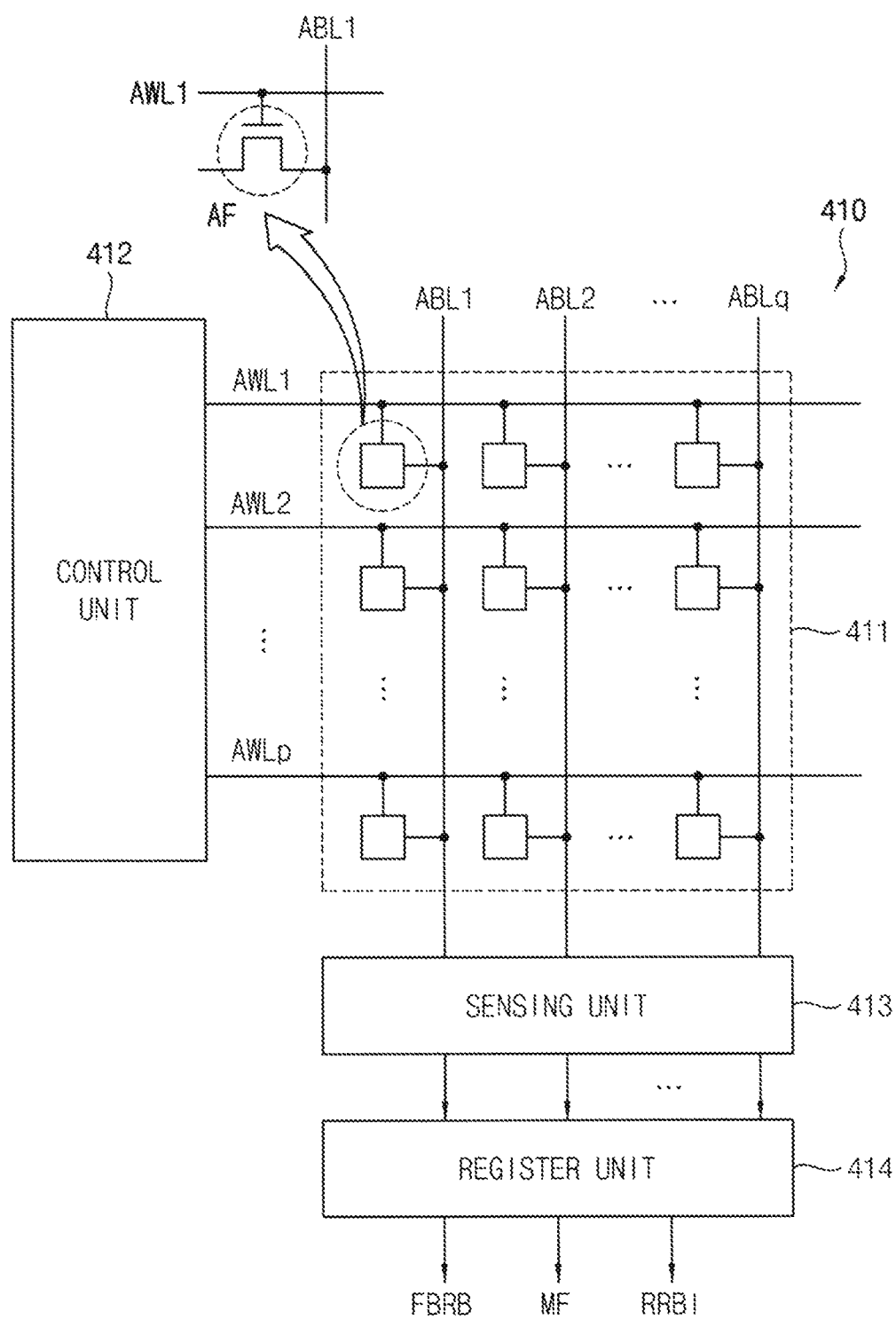
FIG. 7B illustrates an example of the row block information storage table in the first row block fuse circuit of FIG. 7A.

FIG. 7B illustrates an example of the row block information storage table 410 in the first row block fuse circuit of FIG. 7A.

Referring to FIG. 7B, the row block information storage table 410 includes anti-fuse array 411, a control unit 412, a sensing unit 413, and a register unit 414.

The anti-fuse array 411 includes p*q anti-fuses (AFs) which are respectively connected to intersections of p rows and q columns. The anti-fuse array 411 includes p word-lines AWL1 to AWLp for accessing anti-fuses (AFs) disposed at the p rows, and q bit-lines ABL1 to ABLq disposed to correspond to q columns so as to deliver information read from the anti-fuses (AFs).

The control unit 412 programs the defective row block address FBRB, the replacement row block information RRBI, and the master fuse bit MF in the anti-fuse array 411, or the control unit 412 reads the defective row block address FBRB, the replacement row block information RRBI, and the master fuse bit MF from the anti-fuse array 411. The sensing unit 413 may sense and amplify the defective row block address FBRB, the replacement row block information RRBI, and the master fuse bit MF received from the anti-fuse array 411 and output a result of the amplifying. The register unit 414 may temporarily store the defective row block address FBRB, the replacement row block information RRBI, and the master fuse bit MF received from the sensing unit 413. The register unit 414 outputs the defective row block address FBRB to the row block address comparator 425, and outputs the replacement row block information RRBI and/or and the master fuse bit MF to the signal generator 430.

Figure 8:
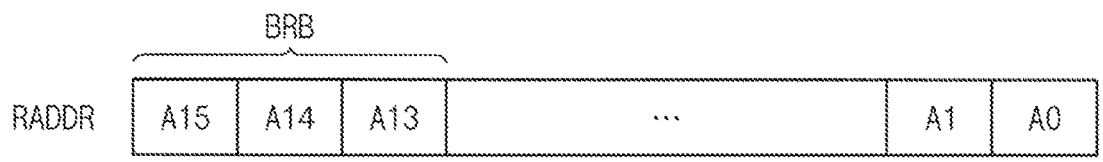
FIG. 8 illustrates an example of the row address in FIG. 7A.

FIG. 8 illustrates an example of the row address in FIG. 7A.

In FIG. 8, it is assumed that the row address RADDR includes 16-bits A0~A15.

Referring to FIG. 8, the upper 3-bits A15~A13 of the row address RADDR may be designated as the row block identity bits BRB. In this case, where the row block identity bits BRB includes 3-bits, the memory blocks MB1~MBk may be divided into eight row blocks disposed in the first direction D1.

Figure 9:
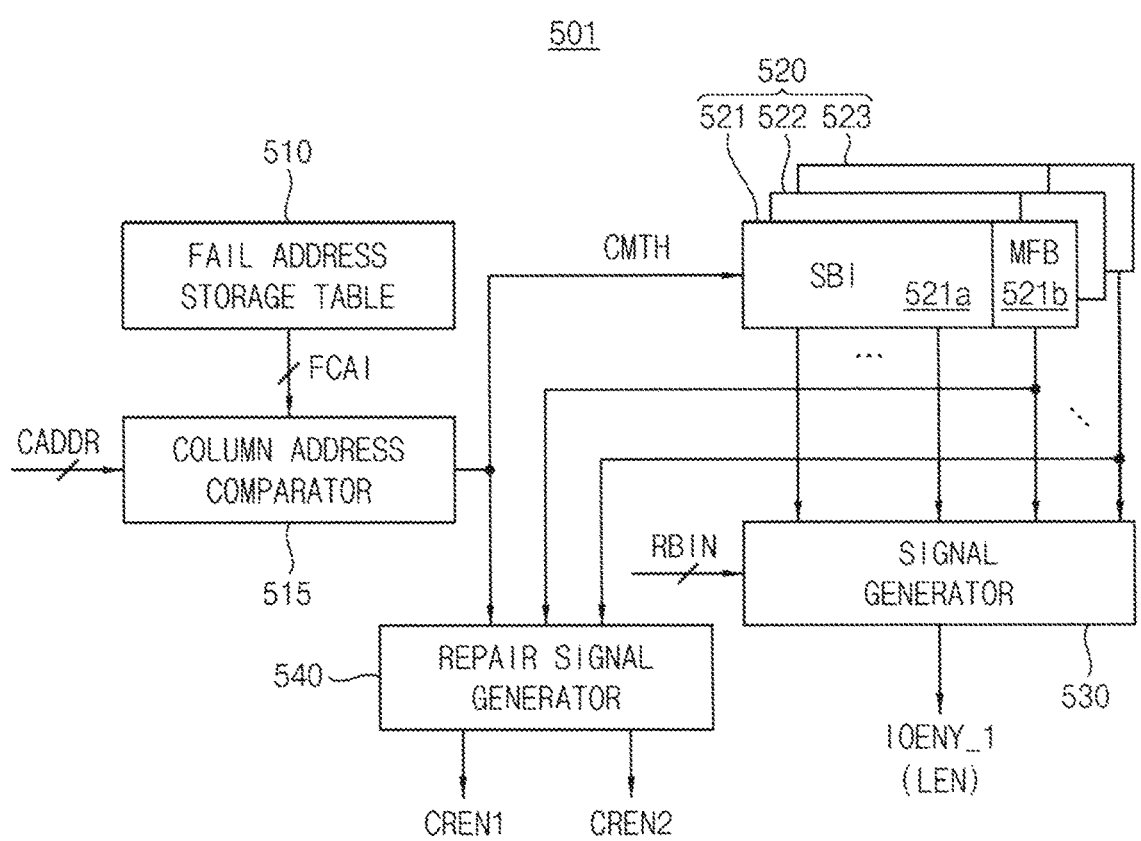
FIG. 9 is a block diagram illustrating a first repair circuit of the repair circuits in FIG. 6 according to example embodiments.

FIG. 9 is a block diagram illustrating a first repair circuit 50_1 of the repair circuits in FIG. 6 according to example embodiments.

Each configuration of the repair circuits 50_2~50_J may be substantially the same as a configuration of the first repair circuit 50_1.

Referring to FIG. 9, the first repair circuit 50_1 includes a fail address storage table 510, a column address comparator 515, a fuse circuit 520, a signal generator 530, and a repair signal generator 540.

The fail address storage table 510 may store fail column address information FCAI associated with column address information of defective cells of a corresponding memory block, and may send the fail column address information FCAI to the column address comparator 515. The column address comparator 515 may compare the column address CADDR with the fail column address information FCAI received from the fail address storage table 510 to output a column match signal CMTH to the fuse circuit 520 and the repair signal generator 540. The column match signal CMTH may indicate whether the column address CADDR matches the fail column address information FCAI. The fail address storage table 510 may have a similar configuration with the row block information storage table 410 of FIG. 7B.

The fuse circuit 520 includes a plurality of fuse sets 521, 522 and 523. The fuse sets 521, 522 and 523 may correspond to segments constituting a corresponding memory block. Each of the plurality of fuse sets 521, 522 and 523 may include a first region 521a and a second region 521b. The first region 521a may store a spare bit-line information SBI of a spare bit-line to repair a defective cells in each of the segments in the corresponding memory block, and the second region 521b may store a master fuse bit MFB associated with a usability of a spare bit-line of the corresponding segment (i.e., usability of a spare bit-line in different segment). In response to the column match signal CMTH, the fuse circuit 520 may provide the spare bit-line information SBI and the master fuse bit MFB to the signal generator 530 and may provide the master fuse bit MFB to the repair signal generator 540.

The signal generator 530 may generate an internal enable signal IOENY_1 associated with activation of the second word-line based on the row block information RBIN, the spare bit-line information SBI, and the master fuse bits MFB. The signal generator 530 may generate local enable signal LEN based on the row block information RBIN, the spare bit-line information SBI, and the master fuse bits MFB.

The repair signal generator 540 may selectively activate each of the first repair signal CREN1 and the second repair signal CREN2 based on the column match signal CMTH and the master fuse bits MFB. For example, when the column match signal CMTH indicates that the column address CADDR does not match the fail column address information FCAI, the repair signal generator 540 deactivates both the first repair signal CREN1 and the second repair signal CREN2 by application of a low level voltage signal. When the first repair signal CREN1 and the second repair signal CREN2 are both deactivated, the first sub column decoder 55_1 in FIG. 6 may activate the column selection line CSL.

For example, when the column match signal CMTH indicates the column address CADDR matches the fail column address information FCAI and the master fuse bit MFB has a low level indicating that a spare bit-line in a corresponding segment is usable, the repair signal generator 540 activates the first repair signal CREN1 by application of a high level voltage signal and deactivates the second repair signal CREN2 by application of a low level voltage signal. In this case, the first sub column decoder 55_1 in FIG. 6 selects the spare column selection line SCSL and the selected spare column selection line SCSL, in turn, selects a spare bit-line in the first segment.

For example, when the column match signal CMTH indicates the column address CADDR matches the fail column address information FCAI and the master fuse bit MFB has a high level voltage indicating that a spare bit-line in a corresponding segment is not usable, the repair signal generator 540 deactivates the first repair signal CREN1 by application of a low level voltage signal, and activates the second repair signal CREN2 by application of a high level voltage signal and the signal generator 530 activates the internal enable signal IOENY_1. In this case, the first sub column decoder 55_1 in FIG. 6 selects the spare column selection line SCSL and a spare bit-line in the second segment may be selected by the spare column selection line SCSL and the internal enable signal IOENY_1.

Figure 10:
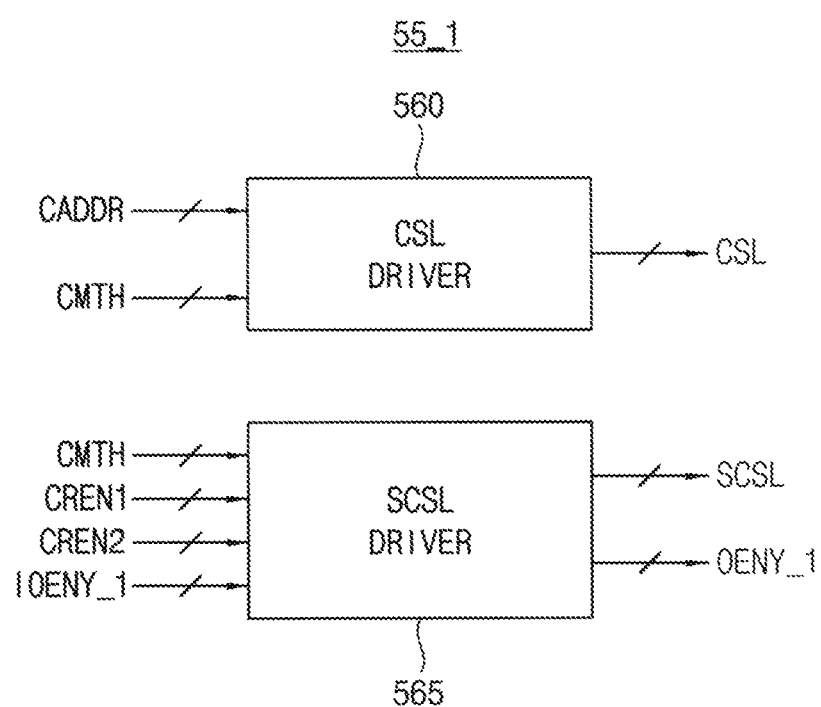
FIG. 10 is a block diagram illustrating a first sub column decoder of the sub column decoders in FIG. 6 according to example embodiments.

FIG. 10 is a block diagram illustrating a first sub column decoder 55_1 of the sub column decoders in FIG. 6 according to example embodiments.

Each configuration of the sub column decoders 55_2~55_J may be substantially the same as a configuration of the first sub column decoder 55_1.

Referring to FIG. 10, the first sub column decoder 55_1 may include a column selection line (CSL) driver 560 and a spare column selection line (SCSL) driver 565.

The column selection line driver 560 may select one of the column selection lines CSL in response to the column address CADDR and the column match signal CMTH. When the column match signal CMTH is a high level CMTH, the column selection line driver 560 does not select the column selection lines CSL. To this end, the column selection line driver 560 may first receive the column match signal CMTH before selecting any one of the column selection lines CSL.

The spare column selection line driver 565 may select the spare column selection line SCSL in response to the column match signal CMTH, the first repair signal CREN1, the second repair signal CREN2, and the internal enable signal IOENY_1, and the spare column selection line driver 565 may selectively activate a second enable signal OENY_1 indicating whether the spare bit-line in the corresponding segment is usable.

Figure 11:
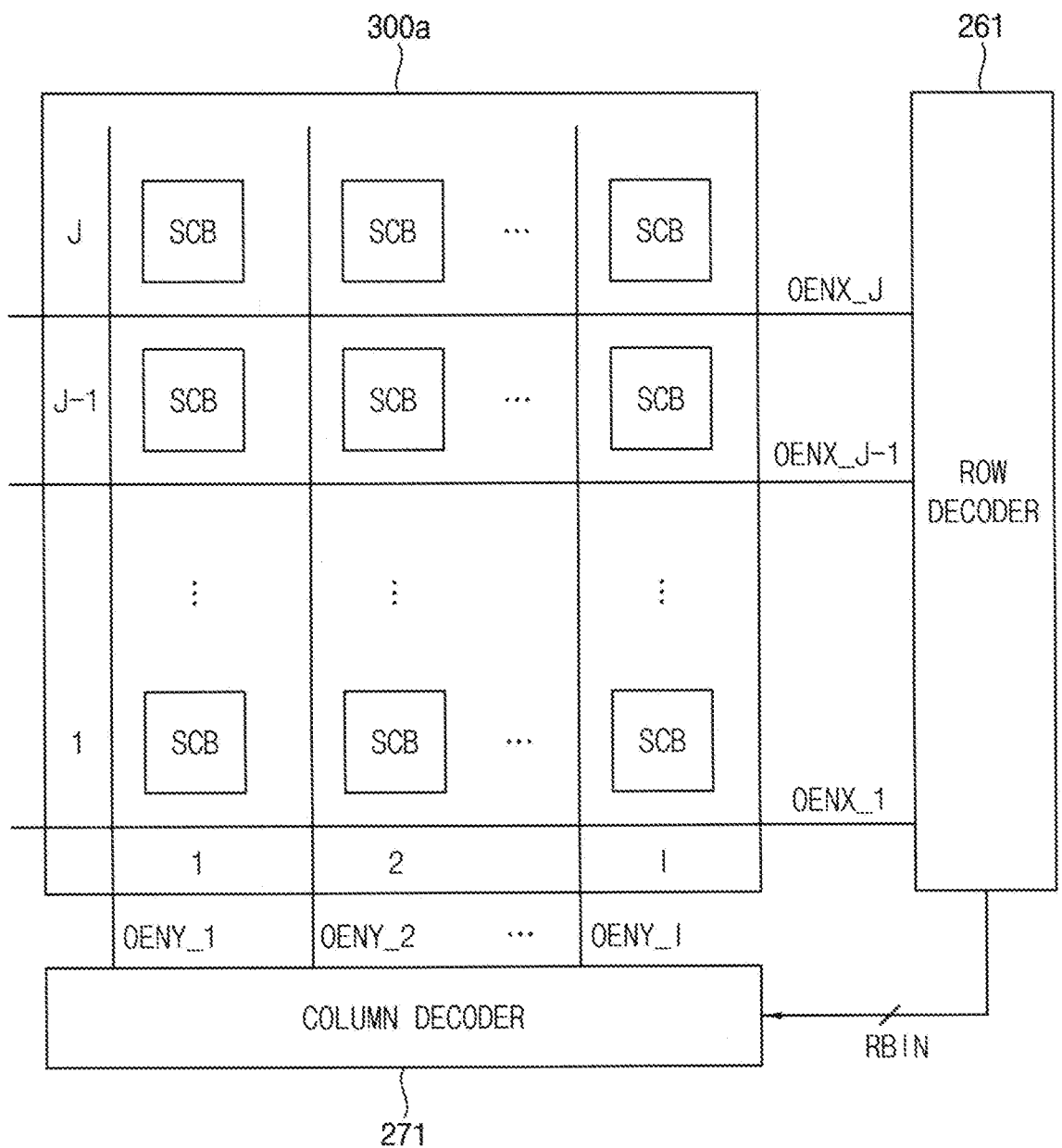
FIG. 11 illustrates transfer of the first enable signals and the second enable signals in the example semiconductor memory device of FIG. 6.

FIG. 11 illustrates that the first enable signals OENX_1~OENX_J and the second enable signals ONEY_1~OENY_I are transferred in the semiconductor memory device of FIG. 6.

Referring to FIG. 11, the row decoder 261 transfers the first enable signals ONEX_1~OENX_J in the first direction D1 with respect to the memory cell array 300a, and the column decoder 271 transfers the second enable signals ONEY_1~OENY_I in the second direction D2 with respect to the memory cell array 300a, based on the row block information RBIN received from the row decoder 261. The first enable signals ONEX_1~OENX_J and the second enable signals ONEY_1~OENY_I are transferred to bit-line sense amplifier regions BLSAB in the corresponding segment (e.g., memory sub-array block SCB) and may determine activation of a local sense amplifier circuit associated with the corresponding segment. In an example embodiment, the column decoder 271 may transfer a local enable signal LEN to a bit-line sense amplifier region BLSAB in the corresponding segment (e.g., memory sub-array block SCB) instead of transferring the second enable signals ONEY_1~OENY_I.

Figure 12:
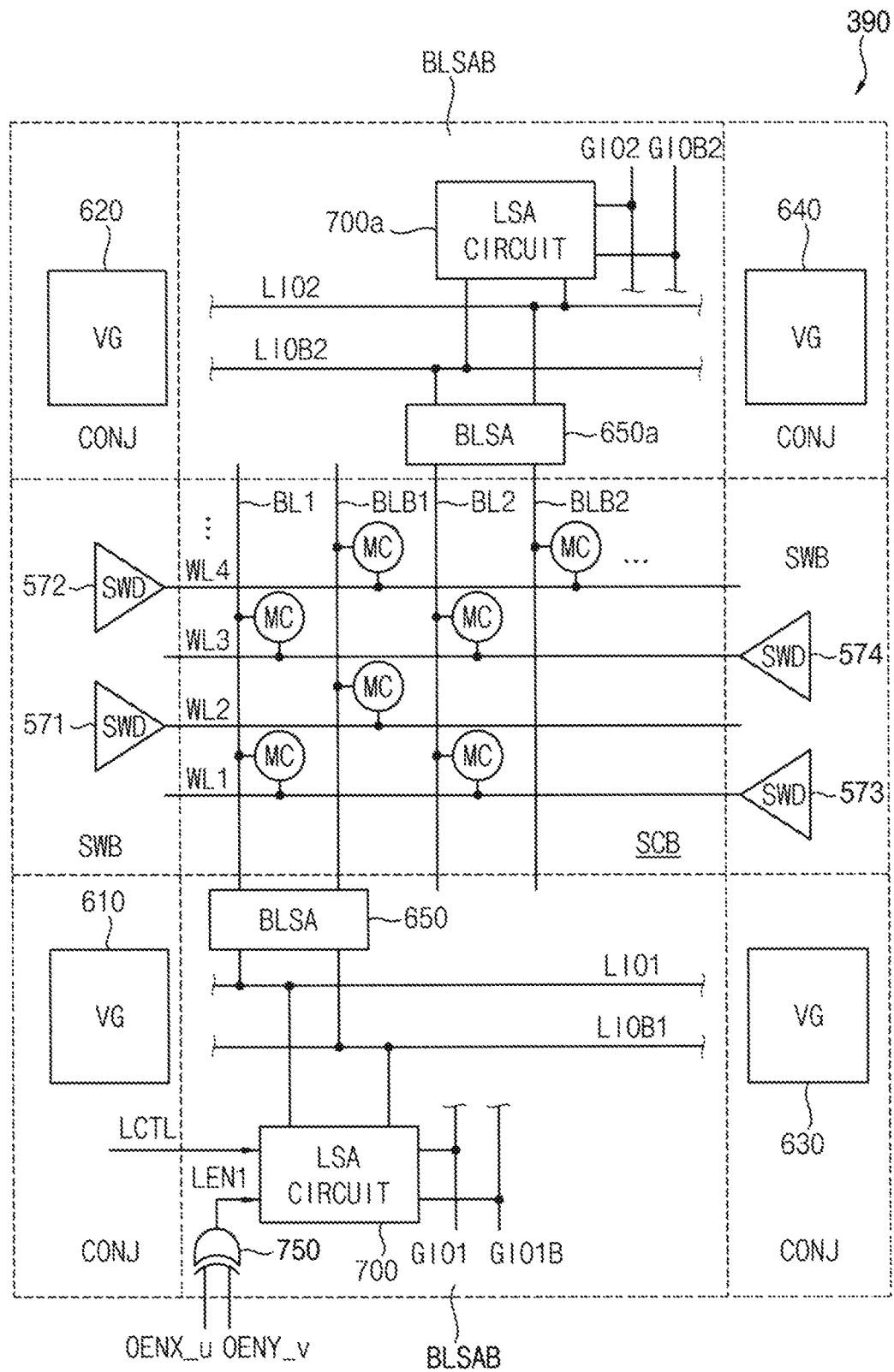
FIG. 12 illustrates a portion of the memory cell array in FIG. 6 according to exemplary embodiments.

FIG. 12 illustrates a portion of the memory cell array in FIG. 6 according to exemplary embodiments.

Referring to FIGS. 6 and 12, in a portion 390 (FIG. 6) of the memory cell array 300a, the sub-array block SCB, the bit-line sense amplifier regions BLSAB, the sub word-line driver regions SWB, and the conjunction regions CONJ are disposed.

The sub-array block SCB includes a plurality of word-lines WL1~WL4 extending in a row direction (the first direction D1) and a plurality of bit-line pairs BL1~BL2 and BLB1~BLB2 extending in a column direction (the second direction D2). The sub-array block SCB includes a plurality of memory cells MCs disposed at intersections between the word-lines WL1~WL4 and the bit-line pairs BL1~BL2 and BLB1~BLB2.

With continued reference to FIG. 12, the sub word-line driver regions SWB include a plurality of sub word-line drivers (SWD) 571, 572, 573 and 574 that respectively drive the word-lines WL1~WL4. The sub word-line drivers (SWD) 571, 572, 573 and 574 may be disposed in different regions relative to the sub-array block SCB. For example, the sub word-line drivers 571 and 572 may be disposed in the sub word-line driver region SWB, which is leftward (in this example) with respect to the sub-array block SCB. In addition, the sub word-line drivers 573 and 574 may be disposed in the sub word-line driver region SWB, which is rightward (in this example) with respect to the sub-array block SCB.

The bit-line sense amplifier regions BLSAB include bit-line sense amplifiers BLSA 650 and 650a coupled to the bit-line pairs BL1~BL2 and BLB1~BLB2, local sense amplifier circuits 700 and 700a, and a logic gate 750. For example, the bit-line sense amplifier BLSA 650 is coupled to bit-lines BL1 and BLB1 and the local sense amplifier circuit 700, and the bit-line sense amplifier BLSA 650a is coupled to bit-lines BL2 and BLB2 and the local sense amplifier circuit 700a. The bit-line sense amplifiers 650 and 650a may sense and amplify a voltage difference between the corresponding bit-line pairs BL and BLB (e.g., between bit-lines BL1 and BLB1, or between bit-lines BL2 and BLB2) to provide the amplified voltage difference to a corresponding local I/O line pair LIO1 and LIOB1. For example, in the case of bit-lines BL1 and BLB1, the amplified voltage difference may be provided to LIO1 and LIOB1, and in the case of bit-lines BL2 and BLB2, the amplified voltage difference may be provided to LIO2 and LIOB2.

The local sense amplifier circuit 700 controls connection between the local I/O line pair LIO1 and LIOB1 and a global I/O line pair GIO1 and GIOB1 in response to a local enable signal LEN1 and a local control signal LCTL, and the local sense amplifier circuit 700a controls connection between the local I/O line pair LIO2 and LIOB2 and a global I/O line pair GIO2 and GIOB2 in response to a corresponding local enable signal (e.g., not illustrated in FIG. 12) and a corresponding local control signal (e.g., not illustrated in FIG. 12). The local sense amplifier circuit 700a may be configured to operate similarly to the local sense amplifier circuit 700. In some embodiments, the local enable signal LEN1 and the local control signal LCTL may be the same for both local sense amplifier circuit 700 and local sense amplifier circuit 700a. In other embodiments, the local enable signal LEN1 and the local control signal LCTL provided to local sense amplifier circuit 700 may be different from the local enable signal and the local control signal provided to local sense amplifier circuit 700a.

The logic gate 750 may receive a first enable signal OENX_u, which corresponds to one of the first enable signals ONEX_1~OENX_J, and a second enable signal OENY_v, which corresponds to one of the second enable signals ONEY_1~OENY_I. The logic gate 750 performs a logical operation on the first enable signal OENX_u and the second enable signal OENY_v, and provides the local enable signal LEN1 to the local sense amplifier circuit 700 based on the logical operation performed on the first enable signal OENX_u and the second enable signal OENY_v. The logic gate 750 may include an exclusive OR (XOR) gate and the logical operation may correspond to an exclusive OR (XOR) operation. For example, when a bit-line in the first segment is to be repaired with a spare bit-line in the second segment, a local sense amplifier circuit associated with the first segment may be deactivated and a local sense amplifier circuit associated with the second segment may be activated.

As illustrated in FIG. 12, the bit-line sense amplifiers 650 and 650a may be alternately disposed at upper portion and a lower portion of the sub-array block SCB. The conjunction regions CONJ are disposed adjacent to the bit-line sense amplifier regions BLSAB, the sub word-line driver regions SWB, and the sub-array block SCB. A plurality of voltage generators 610, 620, 630 and 640 may be disposed in the conjunction regions CONJ.

In FIG. 12, the memory cells MC coupled to the word-lines WL1~WL4 and the bit-line pairs BL1~BL2 and BLB1~BLB2 are illustrated. Although not shown, the sub-array block SCB may include spare cells coupled to the word-lines WL1~WL4 and at least one spare bit-line.

Figure 13:
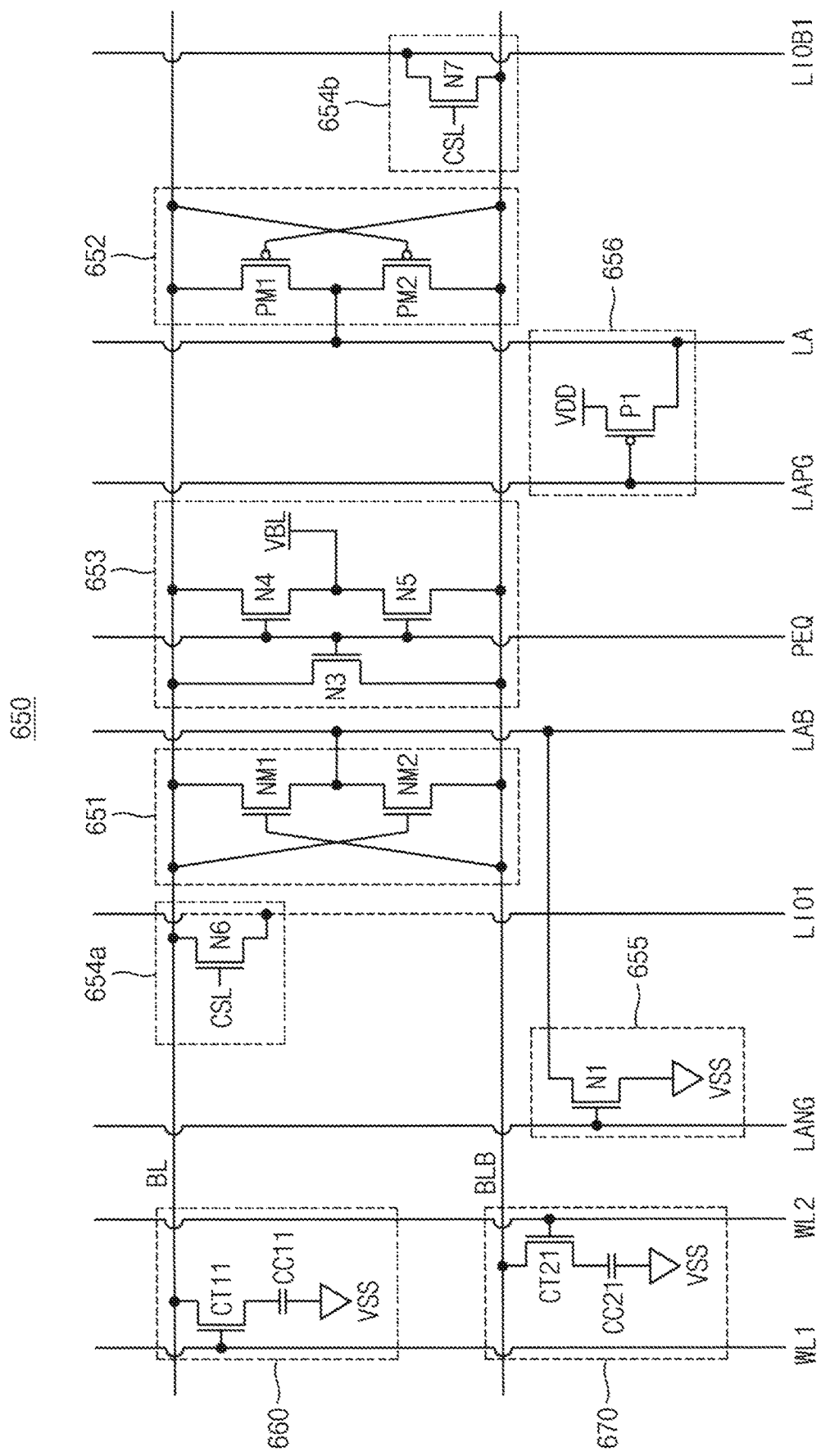
FIG. 13 is a circuit diagram illustrating the bit-line sense amplifier in FIG. 12 according to exemplary embodiments.

FIG. 13 is a circuit diagram illustrating the bit-line sense amplifiers in FIG. 12, according to exemplary embodiments.

Referring to FIG. 13, the bit-line sense amplifier (BLSA) 650 is coupled to bit-lines BL1 and BLB1 of each of memory cells 660 and 670 in the memory cell array 300. Memory cell 660 may correspond to the memory cell MC of sub-array block SCB that is at the intersection of bit line BL1 and word line WL1, and memory cell 670 may correspond to the memory cell MC of sub-array block SCB that is located at the intersection of bit line BLB1 and word line WL2. The bit-line sense amplifier 650 shown in FIG. 12 includes an N-type sense amplifier 651, a P-type sense amplifier 652, a pre-charge circuit 653, column select switches 654a and 654b, an N-type sense amplifier (NSA) driver 655, and a P-type sense amplifier (PSA) driver 656.

The N-type sense amplifier 651 discharges a low-level bit-line of the bit-lines (or, bit-line pair) BL1 and BLB1 to a low level during a sensing operation. The N-type sense amplifier 651 includes two n-channel metal oxide semiconductor (NMOS) transistors NM1 and NM2. A gate of the NMOS transistor NM1 is connected to the bit-line (second bit-line) BLB1, and a drain of the NMOS transistor NM1 is connected to the bit-line (first bit-line) BL1, and a source of the NMOS transistor NM1 is connected to a sense enable line LAB. The NMOS transistor NM2 has a gate connected to the bit-line BL1, a drain connected to the sense enable line LAB, and a source connected to the bit-line BLB1. The N-type sense amplifier 651 connects a low-level bit-line to the sense enable line LAB. The sense enable line LAB is connected to the ground voltage VSS.

The P-type sense amplifier 652 charges a high-voltage bit-line of the bit-lines BL1 and BLB1 with a power supply voltage VDD level at a sensing operation. The P-type sense amplifier 652 includes two p-channel metal oxide semiconductor (PMOS) transistors PM1 and PM2. The PMOS transistor PM1 has a gate connected to the bit-line BLB1, a source connected to the bit-line BL1, and a drain connected to a sense enable line LA. The PMOS transistor PM2 has a gate connected to the bit-line BL1, a source connected to sense enable line LA, and a drain connected to the bit-line BLB1.

The P-type sense amplifier 652 charges a high-voltage bit-line of the bit-lines BL1 and BLB1 with a power supply voltage VDD provided to the sense enable line LA.

The PSA driver 656 provides a charging voltage VDD to the sense enable line LA. Therefore, the transistor PM2 is turned off because the gate of the transistor PM2 is coupled to the bit-line BL1 with a voltage increased by the charge sharing.

The pre-charge circuit 653 pre-charges the bit-lines BL1 and BLB1 with a half voltage VDD/2 in response to a control signal PEQ in sensing operation. When the control signal PEQ is activated, the pre-charge circuit 653 supplies a bit-line pre-charge voltage VBL to the bit-lines BL1 and BLB1. The bit-line pre-charge voltage VBL may be a half voltage VDD/2. The bit-lines BL1 and BLB1 are connected such that their voltages are equalized. If the bit-lines BL1 and BLB1 are charged by the pre-charge level VBL, the control signal PEQ is inactivated. The pre-charge circuit 653 includes NMOS transistors N3, N4, and N5.

The column select switches 654a and 654b provide data sensed by the N-type and P-type sense amplifiers 651 and 652 to input/output lines LIO1 and LIOB1 in response to a column selection signal CSL. The column select switches 654a and 654b are turned on such that the sensed data is transferred to the input/output lines LIO1 and LIOB1. For example, in a read operation when sensing levels of the N-type and P-type sense amplifiers 651 and 652 are stabilized, a column selection signal CSL is activated. Then the column select switches 654a and 654b are turned on such that the sensed data is transferred to the local I/O line pair LIO1 and LIOB1. Voltages of the bit-lines BL1 and BLB1 are varied when charges of bit-lines BL1 and BLB1 are shared with the input/output lines LIO1 and LIOB1. The column select switches 654a and 654b includes NMOS transistors N6 and N7, respectively.

The NSA driver 655 provides a driving signal to the sense enable line LAB of the N-type sense amplifier 651. The NSA driver 655 receives the control signal LANG from the bit-line control signal generator 520 (FIG. 9). Based on the control signal LANG, the NSA driver 655 grounds the sense enable line LAB. The NSA driver 655 includes the ground transistor N1 to control a voltage of the sense enable line LAB. The PSA driver 656 provides the charge voltage VDD to the sense enable line LA of the P-type sense amplifier 652. The PSA driver 656 is controlled by the control signal LAPG from the bit-line control signal generator 520. The control signals LAPG and LANG are complementary to each other.

Figure 14:
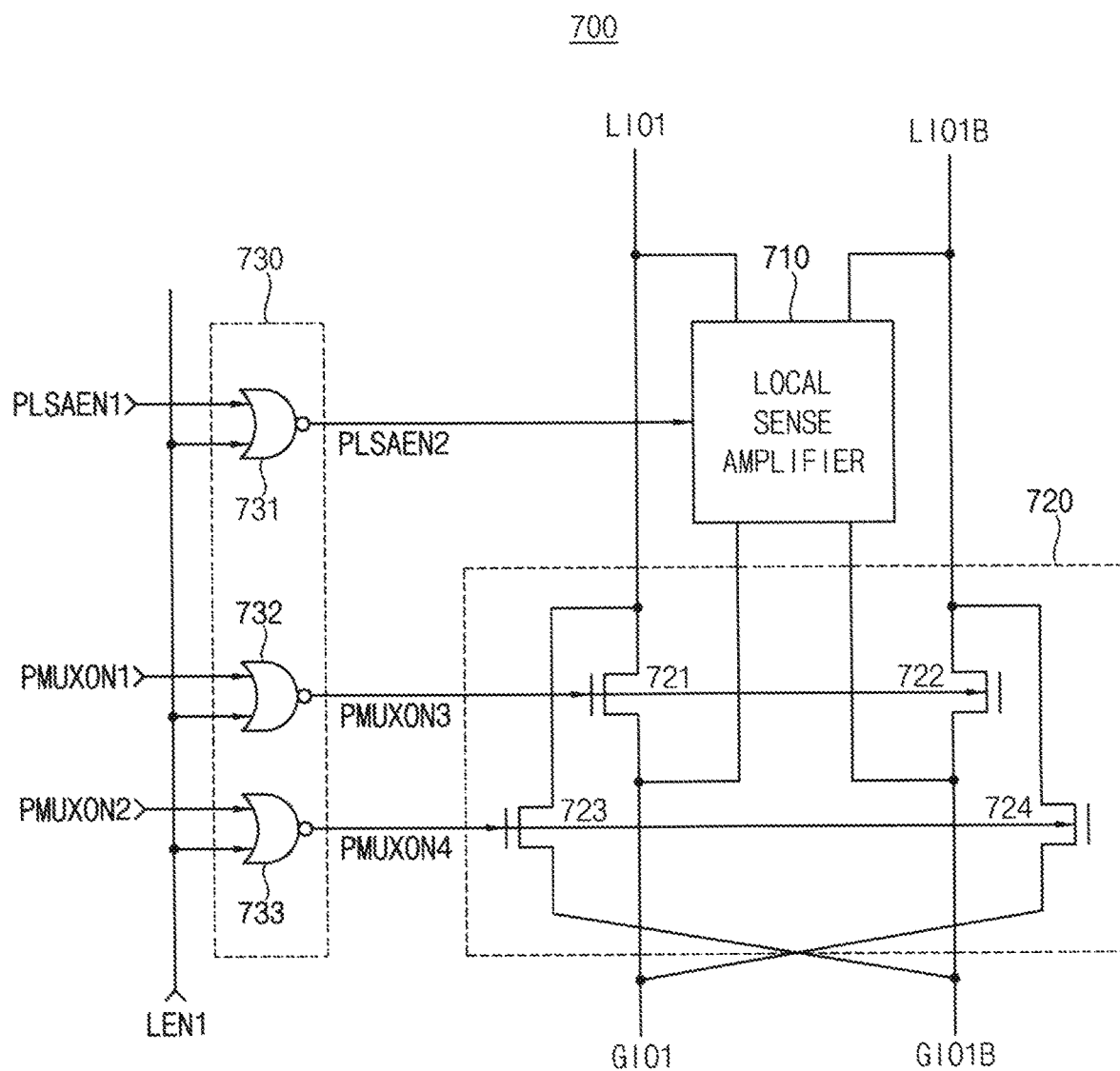
FIG. 14 illustrates the local sense amplifier circuit in FIG. 12.

FIG. 14 illustrates the local sense amplifier circuit in FIG. 12.

Referring to FIG. 14, the local sense amplifier circuit 700 includes a local sense amplifier 710, a local I/O line controller 720, and an activation control circuit 730.

The activation control circuit 730 performs an XOR operation on the local enable signal LEN1 and each of a first local sense enable signal PLSAEN1, a first connection control signal PMUXON1, and a second connection control signal PMUXON2 and respectively outputs a second local sense enable signal PLSAEN2, a third connection control signal PMUXON3, and a fourth connection control signal PMUXON4. Therefore, each logic level of the second local sense enable signal PLSAEN2, the third connection control signal PMUXON3 and the fourth connection control signal PMUXON4 may be same as or may be opposite to each logic level of the first local sense enable signal PLSAEN1, the first connection control signal PMUXON1 and the second connection control signal PMUXON2 according to a logic level of the local enable signal LEN1. The activation control circuit 730 includes first through third gates 731, 732 and 733.

The local sense amplifier 710 amplifies a voltage difference between the local I/O line pair LIO1 and LIOB1 in response to the second local sense enable signal PLSAEN2 to provide the amplified voltage difference to the global I/O line pair GIO1 and GIOB1. The local I/O line controller 720 includes first through fourth NMOS transistors 721, 722, 723 and 724, and controls connection between the local I/O line pair LIO1 and LIOB1 and the global I/O line pair GIO1 and GIOB1 in response to the third connection control signal PMUXON3 and the fourth connection control signal PMUXON4.

For example, when each of the first local sense enable signal PLSAEN1, the first connection control signal PMUXON1, and the second connection control signal PMUXON2 is a high level and the local enable signal LEN1 is a high level, each of the second local sense enable signal PLSAEN2, the third connection control signal PMUXON3, and the fourth connection control signal PMUXON4 becomes a low level. Therefore, the local sense amplifier 710 is disabled and the local I/O line controller 720 cuts off the connection between the local I/O line pair LIO1 and LIOB1 and the global I/O line pair GIO1 and GIOB1.

For example, when each of the first local sense enable signal PLSAEN1, the first connection control signal PMUXON1, and the second connection control signal PMUXON2 is a high level and the local enable signal LEN1 is a low level, each of the second local sense enable signal PLSAEN2, the third connection control signal PMUXON3, and the fourth connection control signal PMUXON4 becomes a high level. Therefore, the local sense amplifier 710 is enabled and the local I/O line controller 720 provides the connection between the local I/O line pair LIO1 and LIOB1 and the global I/O line pair GIO1 and GIOB1.

Figure 15:
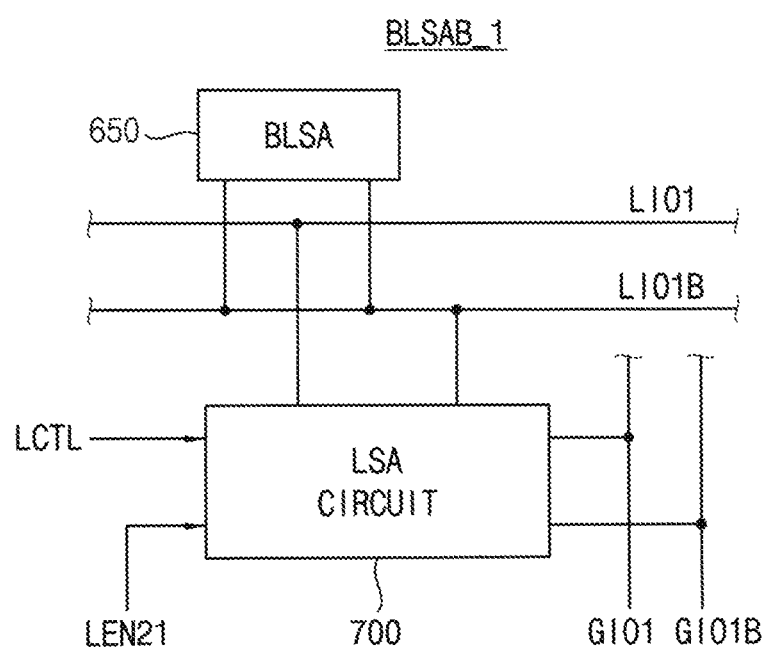
FIG. 15 illustrates another example of the bit-line sense amplifier region in FIG. 12.

FIG. 15 illustrates another example of the bit-line sense amplifier region in FIG. 12.

In FIG. 15, the signal generator 530 in FIG. 9 directly applies a local enable signal LEN21 to the local sense amplifier circuit 700 disposed in a bit-line sense amplifier region BLSAB_1. In this case, the column decoder 271 provides the local enable signal LEN21 and the row decoder 261 does not provide the first enable signals.

Figure 16:
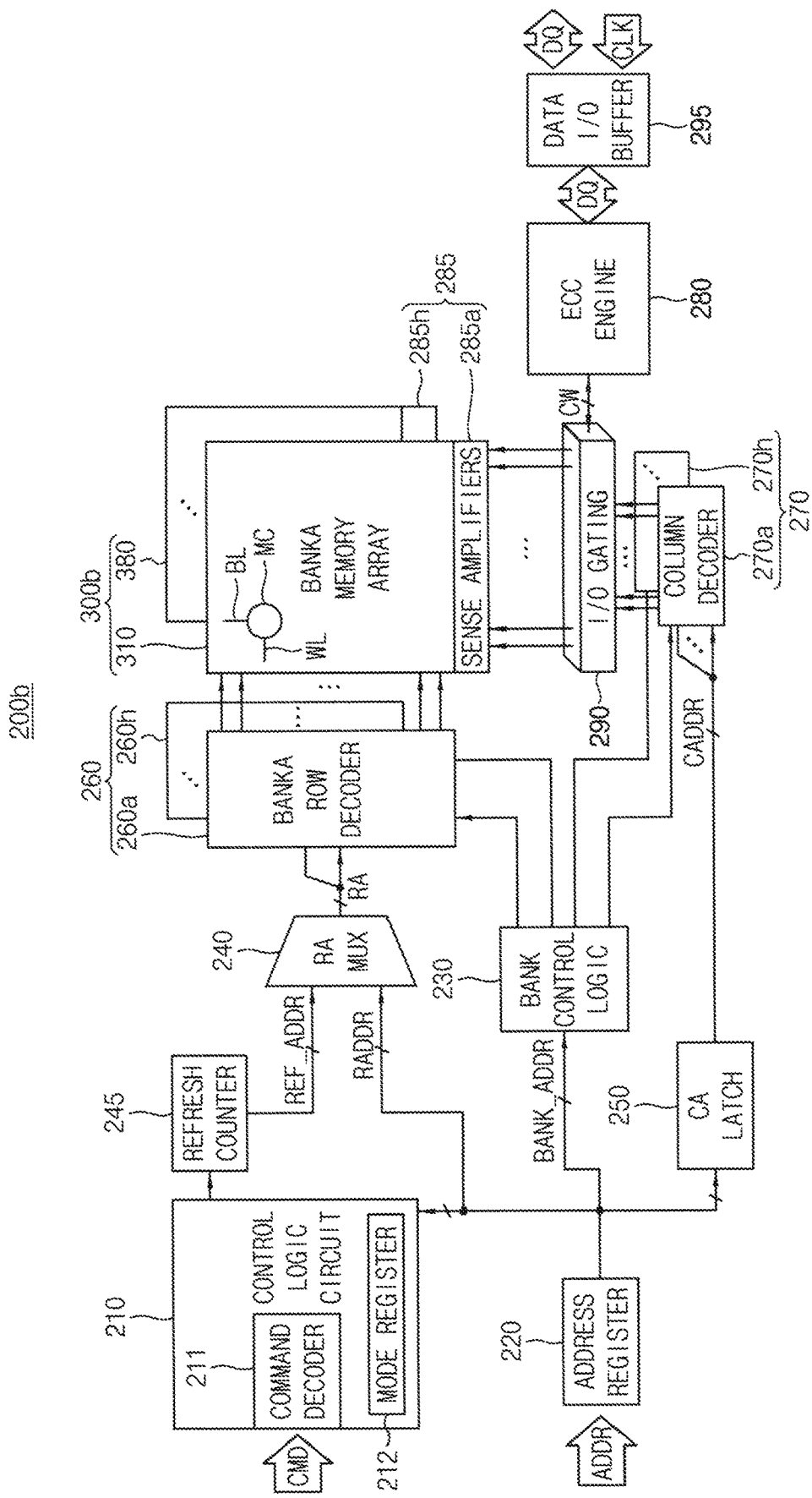
FIG. 16 is a block diagram illustrating another example of the semiconductor memory device in FIG. 1 according to exemplary embodiments.

FIG. 16 is a block diagram illustrating another example of the semiconductor memory device in FIG. 1 according to exemplary embodiments.

Referring to FIG. 16, a semiconductor memory device 200b includes a control logic circuit 210, an address register 220, a bank control logic 230, a refresh counter 245, a row address multiplexer 240, a column address latch 250, a row decoder 260, a column decoder 270, the memory cell array 300b, a sense amplifier unit 285, an input/output (I/O) gating circuit 290, an ECC engine 280, and a data I/O buffer 295.

The memory cell array 300b includes first through eighth bank arrays 310~380. The row decoder 260 includes first through eighth bank row decoders 260a-260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h, and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-line BL.

The address register 220 receives an address ADDR including a bank address BANK_ADDR, a row address RADDR, and a column address CADDR from the memory controller 100. The address register 220 provides the received bank address BANK_ADDR to the bank control logic 230, provides the received row address RADDR to the row address multiplexer 240, and provides the received column address CADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address RADDR from the address register 220, and receives a refresh row address REF_ADDR from the refresh counter 245. The row address multiplexer 240 selectively outputs the row address RADDR or the refresh row address REF_ADDR as a row address RA. The row address RA that is output from the row address multiplexer 240 is applied to the first through eighth bank row decoders 260a~260h.

The activated one of the first through eighth bank row decoders 260a~260h, which is activated by the bank control logic 230, decodes the row address RA that is output from the row address multiplexer 240, and activates a word-line corresponding to the row address RA. For example, the activated bank row decoder applies a word-line driving voltage to the word-line corresponding to the row address RA. In addition, the activated bank row decoder activates a spare word-line corresponding to the spare row address SRA output from the row block information circuit 400 of the activated bank row decoder simultaneously with activating the word-line corresponding to the row address RA.

The column address latch 250 receives the column address CADDR from the address register 220, and temporarily stores the received column address CADDR. For example, the column address latch 250 may temporarily store the received column address CADDR in an internal memory of the column address latch 250. In some embodiments, in a burst mode, the column address latch 250 generates column addresses that increment from the received column address CADDR. The column address latch 250 applies the temporarily stored or generated column address CADDR to the first through eighth bank column decoders 270a~270h.

The activated one of the first through eighth bank column decoders 270a~270h activates a sense amplifier corresponding to the bank address BANK_ADDR and the column address CADDR through the I/O gating circuit 290. The I/O gating circuit 290 includes a circuitry for gating input/output data, and further includes read data latches for storing data that is output from the first through eighth bank arrays 310~380, and write drivers for writing data to the first through eighth bank arrays 310~380.

A codeword CW read from one bank array of the first through eighth bank arrays 310~380 is sensed by a sense amplifier coupled to the one bank array from which the data is to be read, and is stored in the read data latches of the I/O gating circuit 290. The codeword CW stored in the read data latches may be provided to the memory controller 100 via the data I/O buffer 295 after ECC decoding is performed on the codeword CW by the ECC engine 280. The data DQ to be written in one bank array of the first through eighth bank arrays 310~380 provided to the data I/O buffer 295 from the memory controller 100 is written in one bank array by the write drivers of the I/O gating circuit 290 after an ECC encoding is performed on the data DQ by the ECC engine 280.

The data I/O buffer 295 may provide the data DQ from the memory controller 100 to the ECC engine 280 in a write operation of the semiconductor memory device 200b based on the clock signal CLK, and may provide the data DQ from the ECC engine 280 to the memory controller 100 in a read operation of the semiconductor memory device 200b.

In the write operation, the ECC engine 280 may generate parity bits based on the data DQ from the data I/O buffer 295, and may provide the I/O gating circuit 290 with the codeword CW including the data DQ and the parity bits. The I/O gating circuit 290 may write the codeword CW in one bank array.

In the read operation, the ECC engine 280 may receive the codeword CW, read from one bank array, from the I/O gating circuit 290. The ECC engine 280 may perform an ECC decoding on the data DQ based on the parity bits in the codeword CW, may correct at least one error bit in the data DQ, and may provide corrected data to the data I/O buffer 295.

The control logic circuit 210 may control operations of the semiconductor memory device 200b. For example, the control logic circuit 210 may generate control signals for the semiconductor memory device 200b in order to perform a write operation or a read operation. The control logic circuit 210 includes a command decoder 211 that decodes a command CMD received from the memory controller 100 and a mode register 212 that sets an operation mode of the semiconductor memory device 200b.

Each of the first through eighth bank arrays 310~380 may include a plurality of memory blocks, and the memory blocks are divided into a plurality of row blocks based on row block identity bits of the row address RADDR. Each of the first through eighth bank row decoders 260a~260h may employ the row decoder 261 in FIG. 6 and may provide row block information signals to a corresponding one of the first through eighth bank column decoders 270a~270h. Each of the first through eighth bank column decoders 270a~270h may employ the column decoder 271 in FIG. 6 and may repair a bit-line coupled to the defective cell in the first segment with a spare bit-line in the second segment based on the column address CADDR and the row block information signal. In example embodiments, the first segment and the second segment may be in the same memory block.

Figure 17:
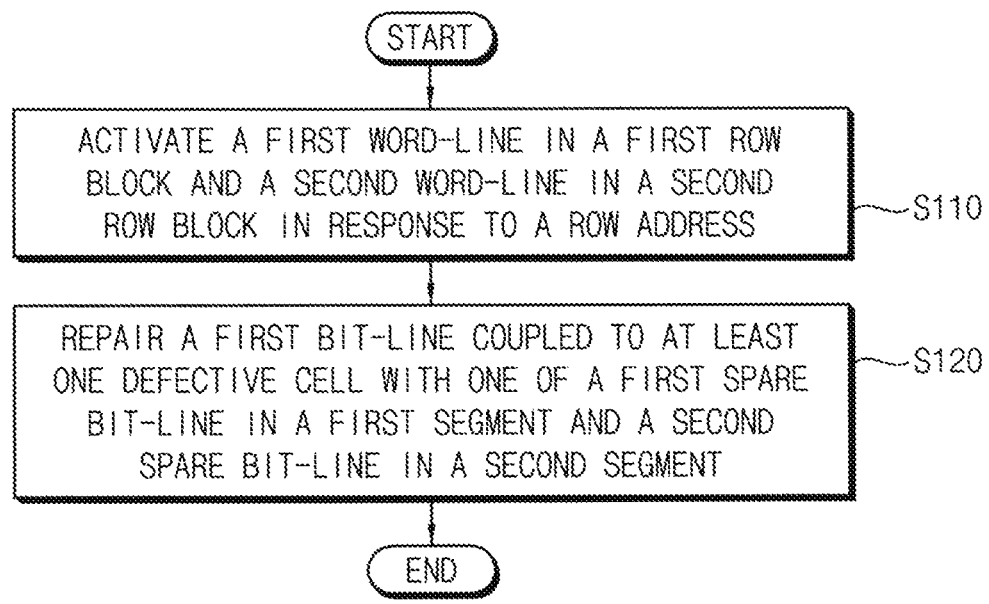
FIG. 17 is a flow chart illustrating a method of operating a semiconductor memory device according to example embodiments.

FIG. 17 is a flow chart illustrating a method of operating a semiconductor memory device according to example embodiments.

Referring to FIGS. 2 through 17, in a method of operating a semiconductor memory device 200 that includes a memory cell array including a plurality of memory blocks, each of the plurality of memory blocks including a plurality of dynamic memory cells coupled to word-lines and bit-lines, each of the plurality of memory blocks being divided into a plurality of row blocks by a row block identity bit corresponding to a portion of bits of a row address, and each of the row blocks including a plurality of sub-array blocks arranged in a first direction, a row decoder 261 activates a first word-line in a first row block in response to the row address RADDR, and activates a second word-line in a second row block different from the first row block when the first row block includes at least one defective cell (S110).

A column decoder 271 repairs a first bit-line coupled to the at least one defective cell with one of a first spare bit-line in the first segment and a second spare bit-line in the second segment in response to a column address CADDR and the row block information signal RBIN indicating that the first row block includes the at least one defective cell (S120).

Figure 18A:
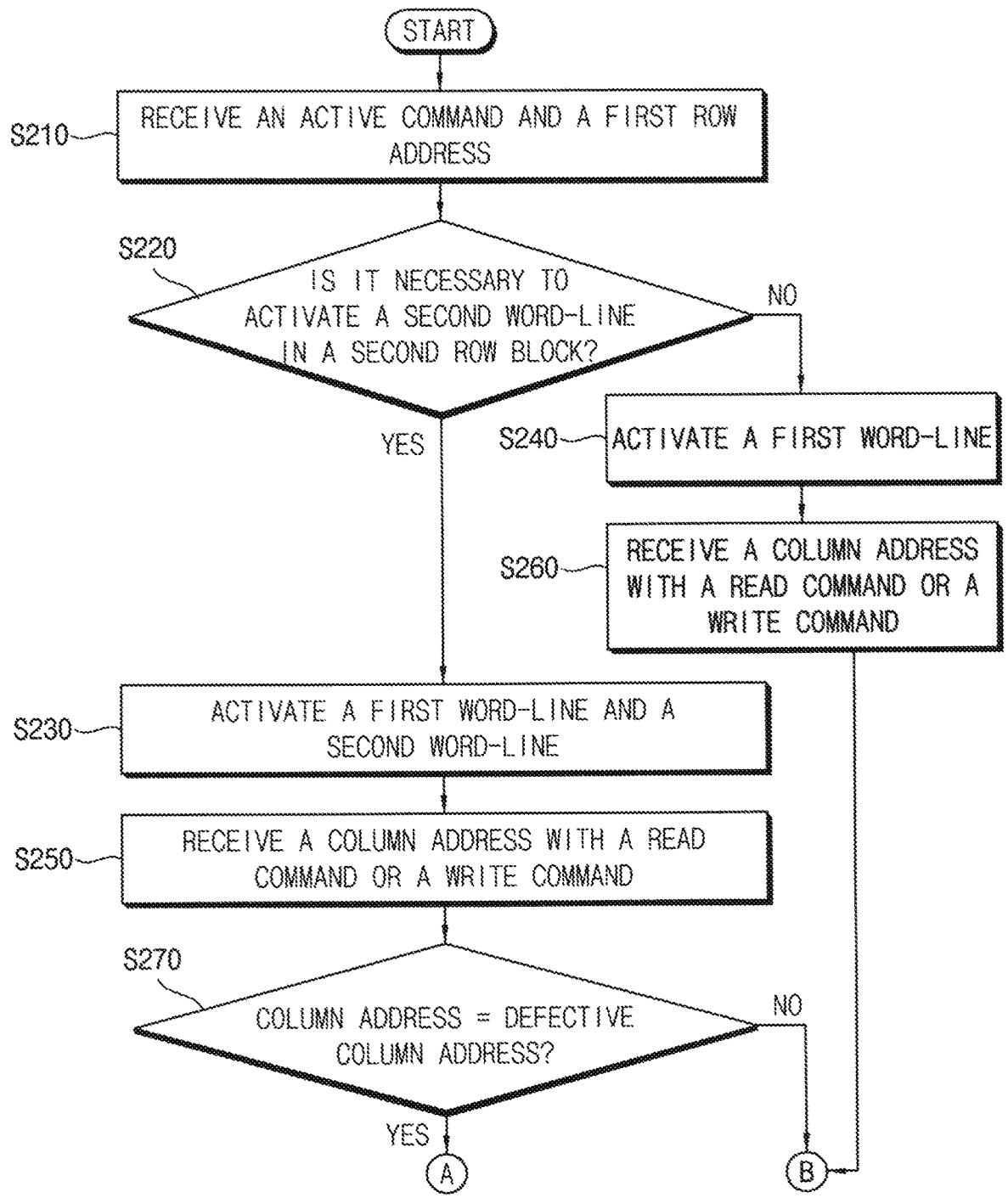
FIGS. 18A and 18B illustrate a method of operating a semiconductor memory device according to example embodiments.
Figure 18B:
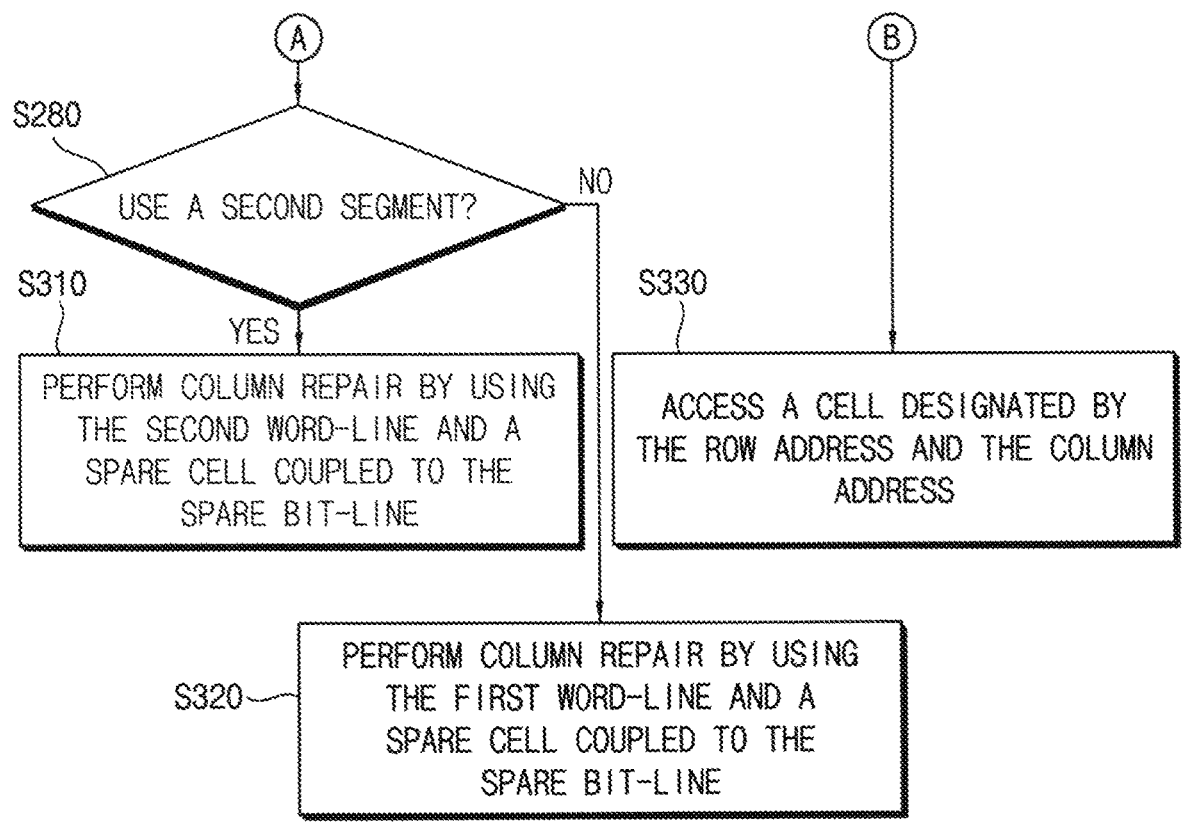

FIGS. 18A and 18B illustrate a method of operating a semiconductor memory device according to example embodiments.

Referring to FIGS. 2 through 16, 18A and 18B, the semiconductor memory device 200 receives an active command and a first row address designating a word-line included in a first row block (S210). The row block information circuit 400 in the row decoder 261 determines whether to activate a second word-line included in a second row block (S220). When the word-line is not to be activated (NO in S220), the row decoder 261 activates the first word-line (S240) and the column decoder 271 receives a column address with a write command or a read command (S260).

When the first row block includes at least one defective cell and the word-line is to be activated (YES in S220), the row decoder 261 activates the first word-line and the second word-line (S230) and the column decoder 271 receives a column address with a write command or a read command (S250). A corresponding repair circuit (e.g., one of repair circuits 50_1~50_I) in the column decoder 271 determines whether the column address CADDR matches a defective column address of a bit-line coupled to the at least one defective cell (S270).

When the column address CADDR matches the defective column address (YES in S270), the corresponding repair circuit in the column decoder 271 determines to use a spare bit-line in the second segment by referring to the fuse circuit 520. When the spare bit-line in the second segment is to be used (YES in S280), the corresponding repair circuit in the column decoder 271 activates the second repair signal CREN2 and activates a corresponding second enable signal OENY, and a corresponding sub column decoder (e.g., one of sub column decoders 55_1~55_I) selects the spare column selection line SCSL and performs a column redundancy operation by using a spare cell coupled to the second word-line and the spare bit-line (S310). For example, the corresponding sub column decoder selects the spare column selection line SCSL such that data is input/output through the spare bit-line in the second segment. When the spare bit-line in the second segment is be used (NO in S280), the corresponding repair circuit in the column decoder 271 activates the first repair signal CREN1 and the corresponding sub column decoder selects the spare column selection line SCSL and performs a column redundancy operation by using a spare cell coupled to the first word-line and the spare bit-line (S320).

When the column address CADDR does not match the defective column address (NO in S270), the defective cell is not coupled to the first word-line. Therefore, the column decoder 271 accesses a memory cell designated by the row address RADDR and the column address CADDR (S330).

Figure 18C:
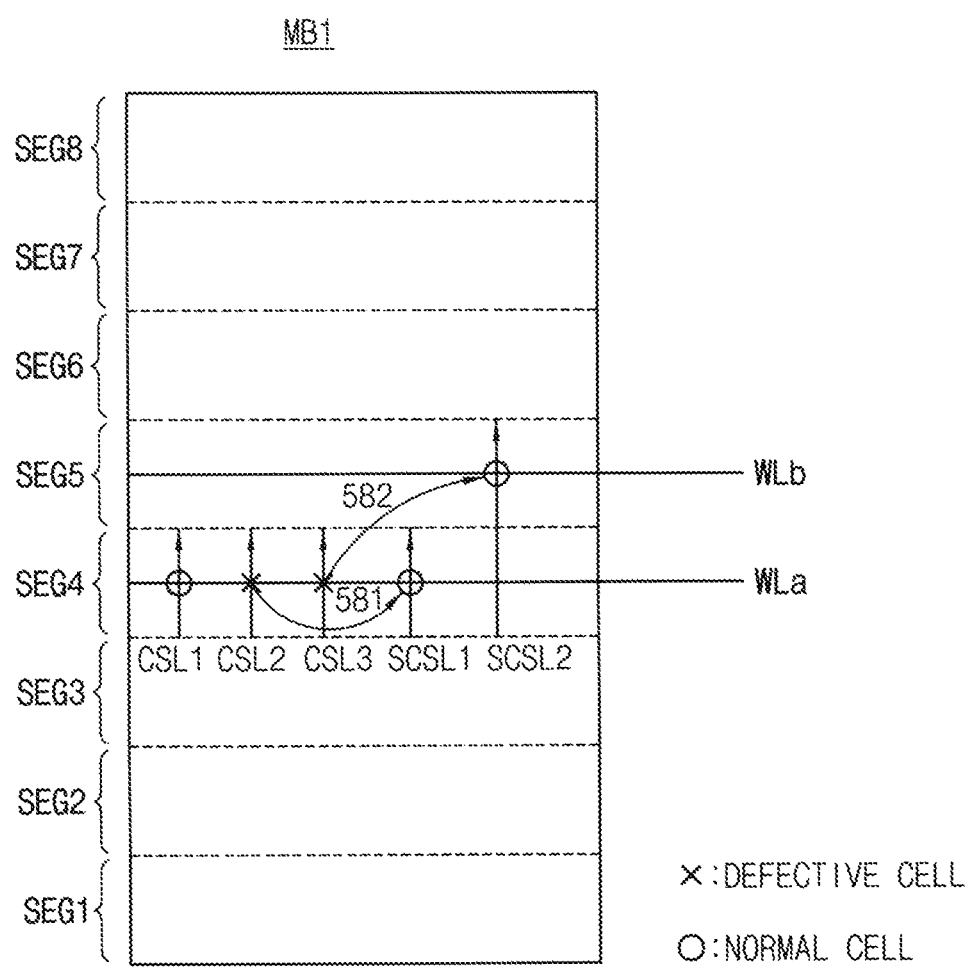
FIG. 18C illustrates access of a memory cell in FIGS. 18A and 18B.

FIG. 18C illustrates that a memory cell is accessed in FIGS. 18A and 18B.

In FIG. 18C, it is assumed that the first memory block MB1 is divided into a plurality of segments SEG1~SEG8.

Referring to FIG. 18C, since a memory cell corresponding to a column selection line CSL1 in a first segment SEG4 is a normal cell, the memory cell coupled to a word-line WLa is selected by the column selection line CSL1. Since a memory cell corresponding to a column selection line CSL2 in the first segment SEG4 is a defective cell, the defective cell coupled to the word-line WLa is repaired with a spare memory cell which is coupled to the word-line WLa and is selected by a spare column selection line SCSL1 as a reference numeral 581 indicates. Since a memory cell corresponding to a column selection line CSL3 in the first segment SEG4 is a defective cell, the defective cell coupled to the word-line WLa is repaired with a spare memory cell which is coupled to a word-line WLb in a second segment SEG5 and is selected by a spare column selection line SCSL2 as a reference numeral 582 indicates.

Therefore, according to example embodiments, when a row block including a segment includes at least one defective cell and spare bit-lines in the same segment are not usable, the column decoder may repair a bit-line coupled to the defective memory cell with a spare bit-line in different segment. The column decoder selects the spare bit-line such that data is input/output through a spare bit-line in a different segment. Accordingly, the semiconductor memory device 200 may increase flexibility of column repair operation and manufacturing yield.

Figure 19:
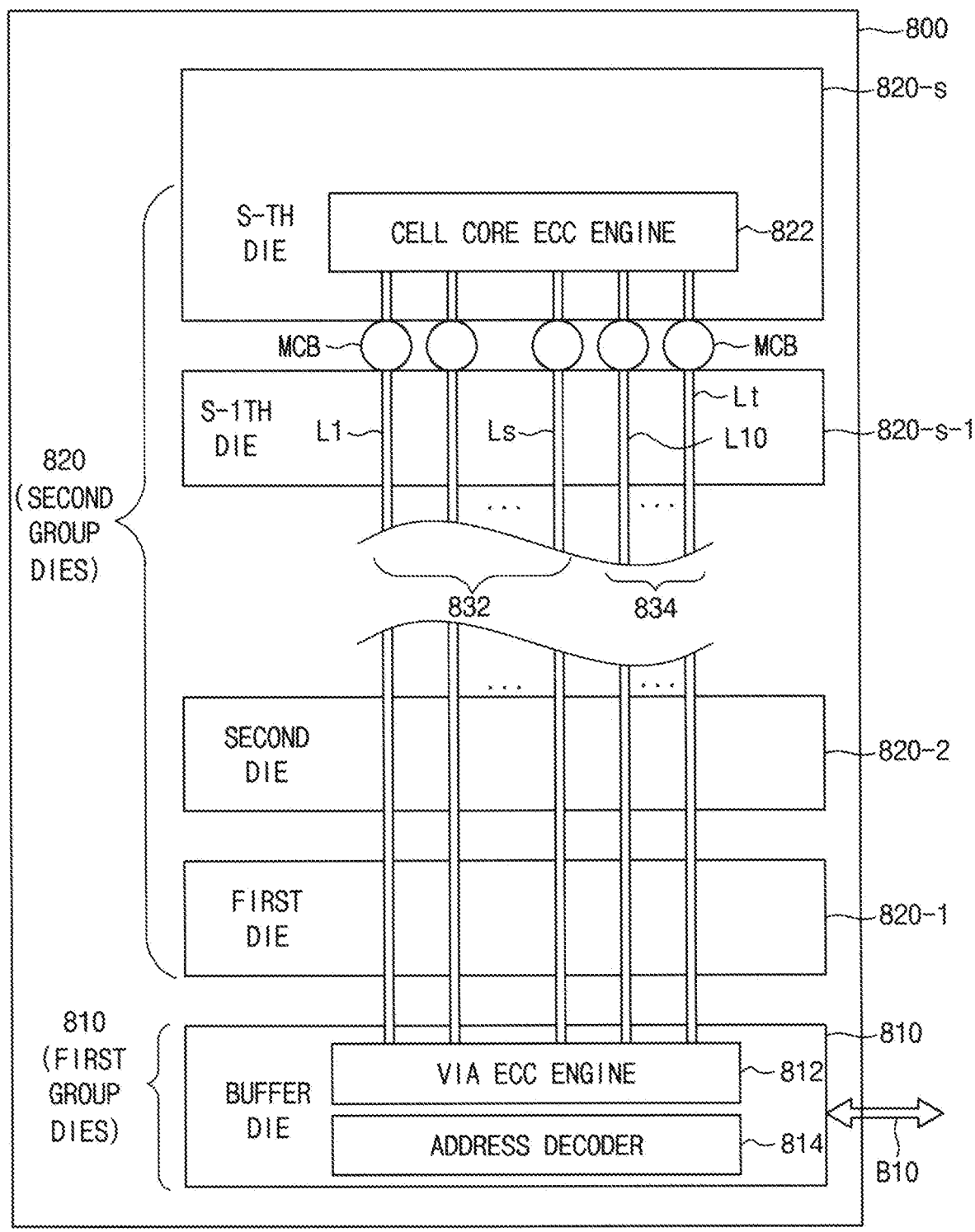
FIG. 19 is a block diagram illustrating a semiconductor memory device according to exemplary embodiments.

FIG. 19 is a block diagram illustrating a semiconductor memory device according to exemplary embodiments.

Referring to FIG. 19, a semiconductor memory device 800 may include first group dies 810 and second group dies 820 providing a soft error analyzing and correcting function in a stacked chip structure.

The first group die 810 may include at least one buffer die. The second group dies 820 may include a plurality of memory dies 820-1 to 820-s, which are stacked on the first group die 810 and convey data through a plurality of through silicon via (TSV) lines extending from memory die 820-s through intervening memory dies 820-s-1 through 820-1 to the first group die 810.

At least one of the memory dies 820-1 to 820-s may include a first type error correction code (ECC) engine 822, which generates transmission parity bits based on transmission data to be sent to the first group die 810. The first type ECC engine 822 may be referred to as "cell core ECC engine".

The buffer die 810 may include a second type ECC engine 812, which corrects a transmission error using the transmission parity bits when a transmission error is detected from the transmission data received through the TSV lines and generates error-corrected data. The second type ECC engine 812 may be referred to as "via ECC engine". The buffer die 810 may include an address decoder 814 and the address decoder 814 may employ the row decoder 261 and the column decoder 271 in FIG. 6.

The semiconductor memory device 800 may be a stack chip type memory device or a stacked memory device which conveys data and control signals through the TSV lines. The TSV lines may be also called "through electrodes".

The first type ECC engine 822 may perform error correction on data which is outputted from the memory die 820-s before the transmission data is sent.

With the above description, a TSV line group 832 which is formed at one memory die 820-r may include a plurality of TSV lines L1 to Ls, and a parity TSV line group 834 may include a plurality of TSV lines L10 to Lt. The TSV lines L1 to Ls of the data TSV line group 832 and the parity TSV lines L10 to Lt of the parity TSV line group 834 may be connected to micro bumps MCB which are correspondingly formed among the memory dies 820-1 to 820-s.

At least one of the memory dies 820-1 to 820-s may include DRAM cells each including at least one access transistor and one storage capacitor.

The semiconductor memory device 800 may have a three-dimensional (3D) chip structure or a 2.5D chip structure to communicate with the memory controller through a data bus B10. The buffer die 810 may be connected with the memory controller through the data bus B10.

The first type ECC engine 822, denoted as the cell core ECC engine, may output transmission parity bits as well as the transmission data through the parity TSV line group 834 and the data TSV line group 832, respectively. The outputted transmission data may be data which is error-corrected by the first type ECC engine 822.

The second type ECC engine 812, denoted as the via ECC engine, may determine whether a transmission error occurs at the transmission data received through the data TSV line group 832, based on the transmission parity bits received through the parity TSV line group 834. When a transmission error is detected, the second type ECC engine 812 may correct the transmission error on the transmission data using the transmission parity bits. When the transmission error is uncorrectable, the second type ECC engine 812 may output information indicating occurrence of an uncorrectable data error.

Figure 20:
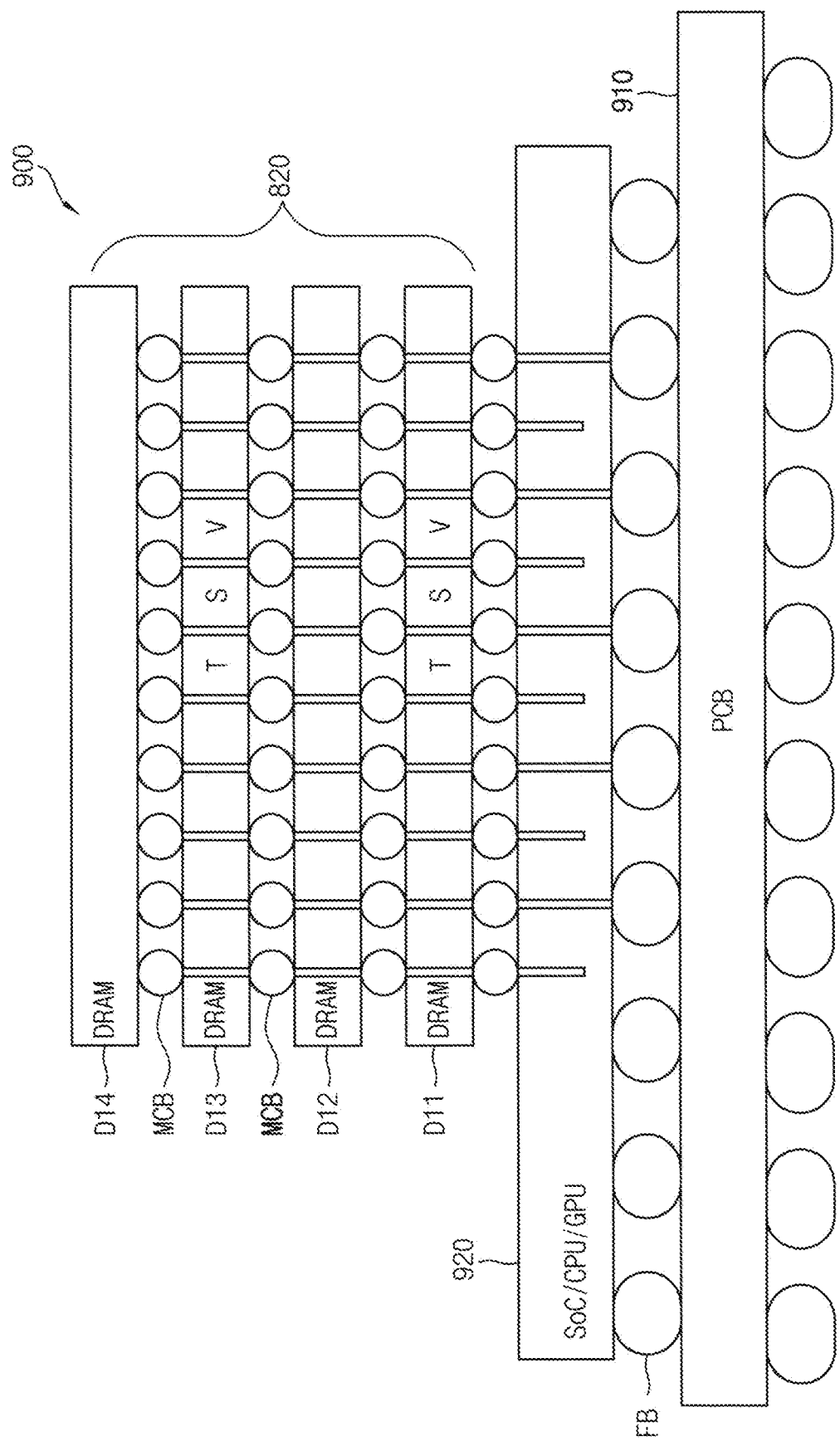
FIG. 20 is a cross-sectional view of a 3D chip structure employing the semiconductor memory device of FIG. 19 according to exemplary embodiments.

FIG. 20 is a cross-sectional view of a 3D chip structure employing the semiconductor memory device of FIG. 19 according to exemplary embodiments.

FIG. 20 shows a 3D chip structure 900 in which a host and a high-bandwidth memory (HBM) are directly connected without an interposer layer.

Referring to FIG. 20, a host die 920 such as a system-on-chip (SoC), a central processing unit (CPU), or a graphic processing unit (GPU) may be disposed on a printed circuit board (PCB) 910 using flip chip bumps FB. Memory dies D11 to D14 may be stacked on the host die 920 to implement a HBM structure such as the second group die 820 in FIG. 19. In FIG. 20, the buffer die 810 or a logic die of FIG. 19 is omitted. However, the buffer die 810 or the logic die may be disposed between the memory die D11 and the host die 910. To implement the HBM (820) structure, TSV lines may be formed at the memory dies D11 to D14. For example, the TSV lines may be formed to extend from memory die D14 through memory dies D13, D12, and D11. The TSV lines may be electrically connected with micro bumps MCB placed between memory dies.

Aspects of the present inventive concept may be applied to systems using semiconductor memory devices.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A semiconductor memory device comprising:
   a memory cell array including a plurality of memory blocks, each of the plurality of memory blocks including a plurality of dynamic memory cells coupled to word-lines and bit-lines, wherein each of the plurality of memory blocks are divided into a plurality of row blocks by at least one row block identity bit corresponding to a portion of bits of a row address, and each of the row blocks includes a plurality of sub-array blocks arranged in a first direction;

a row decoder configured to activate a first word-line in a first row block of the plurality of row blocks in response to the row address, configured to activate a second word-line in a second row block of the plurality of row blocks, the second row block being different from the first row block, when the first row block includes at least one defective cell, and configured to output a row block information signal indicating whether the second word-line is activated, wherein the first row block is associated with a first segment of a plurality of segments, the second row block is associated with a second segment of the plurality of segments, the second segment being different from the first segment, and the plurality of memory blocks are divided into the plurality of segments in a second direction crossing the first direction; and a column decoder configured to receive the row block information signal and to repair a first bit-line coupled to the at least one defective cell with one of a first spare bit-line in the first segment and a second spare bit-line in the second segment in response to a column address and the row block information signal.

2. The semiconductor memory device of claim 1, wherein each of the plurality of segments includes a plurality of bit-lines and at least one spare bit-line, wherein the row address is received with an active command, and wherein the column address is received with a write command or a read command.

3. The semiconductor memory device of claim 1, wherein the row decoder includes a plurality of row block fuse circuits, each row block fuse circuit corresponding to one of the plurality of row blocks, and wherein each of the plurality of row block fuse circuits includes:

a row block information storage table configured to store a defective row block address associated with a defective row block including the at least one defective cell, a row block address information of a corresponding row block, a replacement row block information to determine whether to activate the second word-line and a master fuse bit, the master fuse bit indicating whether the corresponding row block is capable of being used as a replacement row block;

a row block comparator configured to compare the at least one row block identity bit with the defective row block address to output a row block match signal; and a signal generator configured to provide the column decoder with a row block information signal associated with the row block match signal and configured to output a first activation signal associated with activation of the second word-line, based on the row block match signal and the replacement row block information, wherein the row block information storage table is configured to provide the replacement row block information to the signal generator in response to the row block match signal.

4. The semiconductor memory device of claim 1, wherein the column decoder includes:

a plurality of sub column decoders corresponding to the plurality of memory blocks; and a plurality of repair circuits corresponding to the plurality of sub column decoders, and wherein each of the plurality of repair circuits is configured to apply a first repair signal, a second repair signal and an internal enable signal to a corresponding sub column decoder of the plurality of sub column decoders, the internal enable signal being associated with activation of the second word-line.

5. The semiconductor memory device of claim 4, wherein a repair circuit of the plurality of repair circuits corresponding to a first memory block of the plurality of memory blocks is configured to repair the first bit-line with the first spare bit-line by activating the first repair signal and is configured to repair the first bit-line with the second spare bit-line by activating the second repair signal.

6. The semiconductor memory device of claim 4, wherein each of the plurality of repair circuits includes:

a fail address storage table configured to store fail column address information associated with column address information of defective cells of a corresponding memory block of the plurality of memory blocks;

a column address comparator configured to compare the column address with the fail column address information to output a column match signal indicating whether the column address matches the fail column address information;

a fuse circuit that includes a plurality of fuse sets, wherein each of the plurality of fuse sets stores a spare bit-line information on a spare bit-line of each of the segments in the corresponding memory block, and a master fuse bit associated with a usability of a spare bit-line of a corresponding segment;

a signal generator configured to generate the internal enable signal associated with the activation of the second word-line based on the row block information signal, the spare bit-line information, and the master fuse bit; and a repair signal generator configured to selectively activate the first repair signal and the second repair signal based on the column match signal and the master fuse bit.

7. The semiconductor memory device of claim 4, wherein each of the plurality of sub column decoders includes:

a column selection line driver configured to select a column selection line to select the first bit-line in the first segment in response to the column address and a column match signal output by a corresponding repair circuit of the plurality of repair circuits; and a spare column selection line driver configured to selectively activate a second enable signal associated with the second segment and configured to select a spare column selection line to select the spare column selection line such that data is input and output through the first spare bit-line in the first segment or the second spare bit-line in the second segment in response to the column match signal, the first repair signal, the second repair signal and the internal enable signal.

8. The semiconductor memory device of claim 7, wherein the column selection line driver is configured to select the column selection line corresponding to the column address when the column match signal indicates that the column address does not match a fail column address information.

9. The semiconductor memory device of claim 7, wherein the spare column selection line driver is configured deactivate the second enable signal and configured to select the spare column selection line such that the data is input and output through the first spare bit-line in the first segment when the column match signal indicates that the column address matches a fail column address information and the first repair signal is activated.

10. The semiconductor memory device of claim 7, wherein the spare column selection line driver is configured deactivate the second enable signal and configured to select the spare column selection line such that the data is input and output through the second spare bit-line in the second segment when the column match signal indicates that the column address matches a fail column address information and the second repair signal is activated.

11. The semiconductor memory device of claim 4,
wherein the plurality of segments are disposed in the first direction and the second direction of a substrate, and
wherein the memory cell array further includes:
a plurality of sub word-line driver regions disposed between the plurality of segments in the first direction;
a plurality of bit-line sense amplifier regions disposed between the plurality of segments in the second direction; and
a plurality of local sense amplifier circuits disposed in the plurality of bit-line sense amplifier regions.

12. The semiconductor memory device of claim 11, wherein the memory cell array further includes:
a logic gate configured to perform a logical operation on a first enable signal and a second enable signal associated with activation of the second segment to provide a local enable signal to a corresponding local sense amplifier circuit of the plurality of local sense amplifier circuits.

13. The semiconductor memory device of claim 12, wherein the corresponding local sense amplifier circuit corresponding to the second segment is activated and data is input and output through the second spare bit-line in the second segment.

14. The semiconductor memory device of claim 1, further comprising:
a peripheral circuit configured to control the row decoder and the column decoder in response to a command and an address received from an external device,
wherein the peripheral circuit includes an error correction code (ECC) engine configured to perform ECC encoding on data to be stored in the memory cell array and configured to perform ECC decoding on data read from the memory cell array.

15. The semiconductor memory device of claim 14, wherein the peripheral circuit is configured to control repair of the first bit-line with one of the first spare bit-line and the second spare bit-line based on error correction capability of the ECC engine.

16. The semiconductor memory device of claim 1, comprising:
first group dies including at least one buffer die; and
second group dies including a plurality of memory dies, wherein the plurality of memory dies are stacked on the first group dies and configured to convey data through a plurality of through silicon via (TSV) lines,
wherein each of the plurality of memory dies includes a plurality of dynamic memory cells, and
wherein the at least one buffer die includes the row decoder and the column decoder.

17. A semiconductor memory device comprising:
a memory cell array including a plurality of memory blocks, each of the plurality of memory blocks including a plurality of dynamic memory cells coupled to word-lines and bit-lines, wherein each of the plurality of memory blocks is divided into a plurality of row blocks by row block identity bits corresponding to a portion of bits of a row address, and each of the row blocks includes a plurality of sub-array blocks arranged in a first direction; and
an address decoder configured to change a physical row address of a memory cell that stores or outputs data based on a column address received with a write command or a read command,
wherein the address decoder includes:
a row decoder configured to activate a first word-line in a first row block of the plurality of row blocks in response to the row address, configured to activate a second word-line in a second row block of the plurality of row blocks when the first row block includes at least one defective cell and configured to output a row block information signal indicating that the second word-line is activated, wherein the first row block is associated with a first segment of a plurality of segments, the second row block is associated with a second segment of the plurality of segments different from the first segment, and the plurality of memory blocks are divided into the plurality of segments in a second direction crossing the first direction; and
a column decoder configured to receive the row block information signal output from the row decoder and to repair a first bit-line coupled to the at least one defective cell with one of a first spare bit-line in the first segment and a second spare bit-line in the second segment in response to a column address and the row block information signal.

18. The semiconductor memory device of claim 17, wherein the row address is received with an active command.

19. A method of operating a semiconductor memory device, wherein the semiconductor memory device includes a memory cell array including a plurality of memory blocks, each of the plurality of memory blocks including a plurality of dynamic memory cells coupled to word-lines and bit-lines, wherein each of the plurality of memory blocks is divided into a plurality of row blocks by a row block identity bit corresponding to a portion of bits of a row address, and each of the row blocks includes a plurality of sub-array blocks arranged in a first direction, the method comprising:
activating, by a row decoder, a first word-line in a first row block of the plurality of row blocks in response to the row address;
activating a second word-line in a second row block of the plurality of row blocks different from the first row block when the first row block includes at least one defective cell;
outputting by the row decoder, a row block information signal indicating that the second word-line in the second row block has been activated;
receiving, by a column decoder, the row block information signal; and
repairing, by the column decoder, a first bit-line coupled to the at least one defective cell with one of a first spare bit-line in a first segment of a plurality of segments and a second spare bit-line in a second segment of the plurality of segments in response to a column address and the row block information signal,
wherein the row block information signal indicates that the first row block includes the at least one defective cell.

20. The method of claim 19,
wherein the first row block is associated with the first segment of the plurality of segments, the second row block is associated with the second segment of the plurality of segments different from the first segment, and the plurality of memory blocks are divided into the plurality of segments in a second direction crossing the first direction,
wherein each of the plurality of segments includes a plurality of bit-lines and at least one spare bit-line,
wherein the row address is received with an active command, and
wherein the column address is received with a write command or a read command.

* * * * *